US012613260B2

(12) United States Patent
Sakamaki et al.

(10) Patent No.: US 12,613,260 B2
(45) Date of Patent: Apr. 28, 2026

(54) METHOD FOR DETERMINING CONTACT OR CONNECTION STATE, AND INFORMATION PROCESSING DEVICE

(71) Applicant: National Institute of Advanced Industrial Science and Technology, Tokyo (JP)

(72) Inventors: Ryo Sakamaki, Tsukuba (JP); Masahiro Horibe, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 403 days.

(21) Appl. No.: 18/267,124

(22) PCT Filed: Nov. 11, 2021

(86) PCT No.: PCT/JP2021/041451
§ 371 (c)(1),
(2) Date: Jun. 14, 2023

(87) PCT Pub. No.: WO2022/130845
PCT Pub. Date: Jun. 23, 2022

(65) Prior Publication Data
US 2024/0012026 A1     Jan. 11, 2024

(30) Foreign Application Priority Data
Dec. 16, 2020     (JP) ................................. 2020-208189

(51) Int. Cl.
G01R 1/067 (2006.01)
G01R 31/28 (2006.01)

(52) U.S. Cl.
CPC ...... G01R 1/06794 (2013.01); G01R 31/2822 (2013.01)

(58) Field of Classification Search
CPC .............. G01R 31/086; G01R 19/2513; H02J 2203/10; H02J 13/00002
See application file for complete search history.

(56) References Cited

U.S. PATENT DOCUMENTS

2010/0206040 A1     8/2010   Ebara

FOREIGN PATENT DOCUMENTS

JP          H07-128385 A     5/1995
JP          H09-107011 A     4/1997
(Continued)

OTHER PUBLICATIONS

Tan, et al."The Use of Current Probes in S-parameter Determination", 2010 International Conference on Computer Design and Applications (ICCDA 2010) (Year: 2010).*
(Continued)

*Primary Examiner* — Catherine T. Rastovski
*Assistant Examiner* — Toni D Sauncy
(74) *Attorney, Agent, or Firm* — Troutman Pepper Locke LLP; James E. Armstrong, IV; Joshua L. Jones

(57)     ABSTRACT

A determination method according to the present application includes: (A) a step for measuring, at a plurality of frequencies, an S-parameter at the current probe location or in the current coaxial connector or waveguide connection state; (B) a step for calculating a coefficient matrix for fitting a prescribed function matrix to the measured S-parameter frequency properties; (C) a step for calculating a first local outlier factor on the basis of the calculated coefficient matrix; and (D) a determination step for determining, on the basis of the relationship between a threshold and the calculated first local outlier factor, whether a first state in which the probe is contacting the prescribed target, or a second (Continued)

8 HIGH FREQUENCY CHARACTERISTIC INSPECTION SYSTEM

3 V N A

7 CONTROL DEVICE

20 MICROSCOPE

19 DUT

17 TILT STAGE

17 TILT STAGE

ROTATION AXIS R

4 FREQUENCY EXTENSION UNIT

4 FREQUENCY EXTENSION UNIT

16 PROBE STAGE

1 PROBE

1 PROBE

5 PEDESTAL

2a TRANSLATION STAGE

2b ROTATION STAGE

2 SAMPLE STAGE state in which there is a connection failure between the coaxial connector or the waveguide and the prescribed target exists.

12 Claims, 28 Drawing Sheets

(56)                References Cited

FOREIGN PATENT DOCUMENTS

JP          2004-279270 A      10/2004
JP          2009-008523 A       1/2009

OTHER PUBLICATIONS

TELEDYNE-LECROY (Equipment manufacturer resource, "LAB 1025—An Introduction to S-Parameters", Mar. 13, 2009, available on line) (Year: 2009).*
Su et al., "An Efficient Density-Based Local Outlier Detection Approach for Scattered Data," IEEE Access, vol. 7, pp. 1006-1020, 2019 (Year: 2019).*
Suri, et al. (Editors), Outlier Detection: Techniques and Applications—A Data Mining Perspective, SPRINGER Intelligent Systems Reference Library, vol. 155, @2019, ISBN 978-3-030-05127-3 (eBook) (Year: 2019).*
Hammler, et al., "Free-Space Permittivity Measurement at Terahertz Frequencies With a Vector Network Analyzer" IEEE Transactions on Terahertz Science and Technology, vol. 6, No. 6, Nov. 2016 (Year: 2016).*
Kuhlmann, et al., "Best Practice Guide for Planar S-Parameter Measurements using Vector Network Analysers", EMPIR I 14IND02 PlanarCal, 2018. Physikalisch-Technische Bundesanstalt (PTB) , Sep. 2018 (Year: 2018).*
Ryo Sakamaki et al., "Measurement Uncertainty Analysis for On-Wafer TRL Calibration Using Precision RF Probing Technique", 2018 Conference on Precision Electromagnetic Measurements (CPEM 2018), IEEE, Jul. 8, 2018, pp. 1-2. (cited in the Apr. 19, 2024 Seach Report issued for EP21906209.8).
Extended European Search Report issued in the EP Patent Application No. 21906209.8, mailed on Apr. 19, 2024.
Z. Pi et al., "An introduction to millimeter-wave mobile broadband systems", IEEE Commun. Mag., vol. 49, No. 6, pp. 101-107, Jun. 6, 2011. (discussed in the spec).
E. C. Strinati et al., "6G: The Next Frontier: From Holographic Messaging to Artificial Intelligence Using Subterahertz and Visible Light Communication", IEEE Vehicular Tech. Mag., vol. 14, No. 3, Aug. 1, 2019. (discussed in the spec).
K. H. K. Yau et al., "On-wafer S-parameter de-embedding of silicon active and passive devices up to 170 GHz", In Microwave Symposium Dig., 2010, pp. 600-603. (discussed in the spec).
S. Amakawa et al., "Process parameter calibration for millimeter-wave CMOS back-end device design with electromagnetic field analysis", in 2014 Int. Conf. Microelectronic Test Structures (ICMTS), 2014, pp. 182-187. (discussed in the spec).
R. G. Clarke et al., "A bilateral comparison of on-wafer S-parameter measurements at millimeter wavelengths", in 69th ARFTG Microwave Measurement Conference, 201+B190, pp. 1-7, 2007. (discussed in the spec).
D. F. Williams et al., "Comparison of on-wafer calibrations", in 38th ARFTG Dig., 1991, pp. 68-81. (discussed in the spec).
R. G. Clarke et al., "An intra-laboratory investigation of on-wafer measurement reproducibility at millimeter-wave frequencies", in 90th ARFTG Microwave Measurement Conference, 2017, pp. 1-6. (discussed in the spec).
T. Probst et al., "110 GHz on-wafer measurement comparison on alumina substrate", in 90th ARFTG Dig., 2017, pp. 1-4. (discussed in the spec).
A. M. E. Safwat et al, "Sensitivity analysis of calibration standards for SOLT and LRRM", in 58th ARFTG Dig., 2001, pp. 1-10. (discussed in the spec).
J. E. Pence, "Verification of LRRM calibrations with load inductance compensation for CPW measurements on GaAs substrates", in 42nd ARFTG Dig., 1993, pp. 45-47. (discussed in the spec).
L. Chen et al., "Terahertz micromachined on-wafer probes: Repeatability and Reliability", IEEE Trans. Microwave Theo. Tech., vol. 60, No. 9, pp. 2894-2902, Jul. 3, 2012. (discussed in the spec).
F. T. K. Retzow et al., "Automated calibration of RF on-wafer probing and evaluation of probe misalignment effects using a desktop micro-factory", J. Comput. Commun., vol. 4, No. 3, pp. 61-67, Mar. 2, 2016. (discussed in the spec).
K. Daffe et al., "RF wafer probing with improved contact repeatability using nanometer positioning", in 87th ARFTG Microwave Measurement Conference, 2016, pp. 1-4. (discussed in the spec).
C. Caglayan et al., "Non-Contact Probes for On-Wafer Characterization of Sub-Millimeter-Wave Devices and Integrated Circuits", IEEE Trans. Microwave Theo. Tech., vol. 62, No. 11, pp. 2791-2801, Sep. 17, 2014. (discussed in the spec).
R. Sakamaki et al., "Realization of accurate on-wafer measurement using precision probing technique at millimeter-wave frequency", IEEE Trans. Inst. Meas., vol. 67, No. 8, pp. 1940-1945, Mar. 5, 2018. (discussed in the spec).
R. Sakamaki et al., "Accuracy Improvement of On-wafer Measurement at Millimeter-wave Frequency by a Full- automatic RF probe-tip Alignment Technique", in 91st ARFTG conference digest, Philadelphia, USA, Jun. 2018, pp. 1-4. (discussed in the spec).
R. Sakamaki et al., "Transmission loss of screen-printed metallization at millimeter-wave frequency", Electron. Express, vol. 16 no. 3, 20181081, Feb. 1, 2019. (discussed in the spec).
R. Sakamaki et al., "Demonstration of dielectric measurement using a probe-backside reflection method up to 300 GHz", Jpn. J. Appl. Phys., vol. 58, SLLE02, Aug. 22, 2019. (discussed in the spec).
R. Sakamaki et al., "Precision adjustment of probe tilt angle with RF signal detection technique", IEEE Trans. Inst. Meas., 2020. (discussed in the spec).
R. Sakamaki et al., "Long-term stability test on on-wafer measurement system in NMIJ", in CPEM 2020 Dig., 2020, pp. 1-2. (discussed in the spec).
R. Sakamaki et al., "Probe Positioner and Probe Tip Calibration for Traceable On-Wafer Measurement", in 92nd ARFTG conference digest, Orlando, USA, Jan. 2019, pp. 1-4. (discussed in the spec).

* cited by examiner

----- Gap　　——— Dummy-fill　　——— Pad

Figure 11:
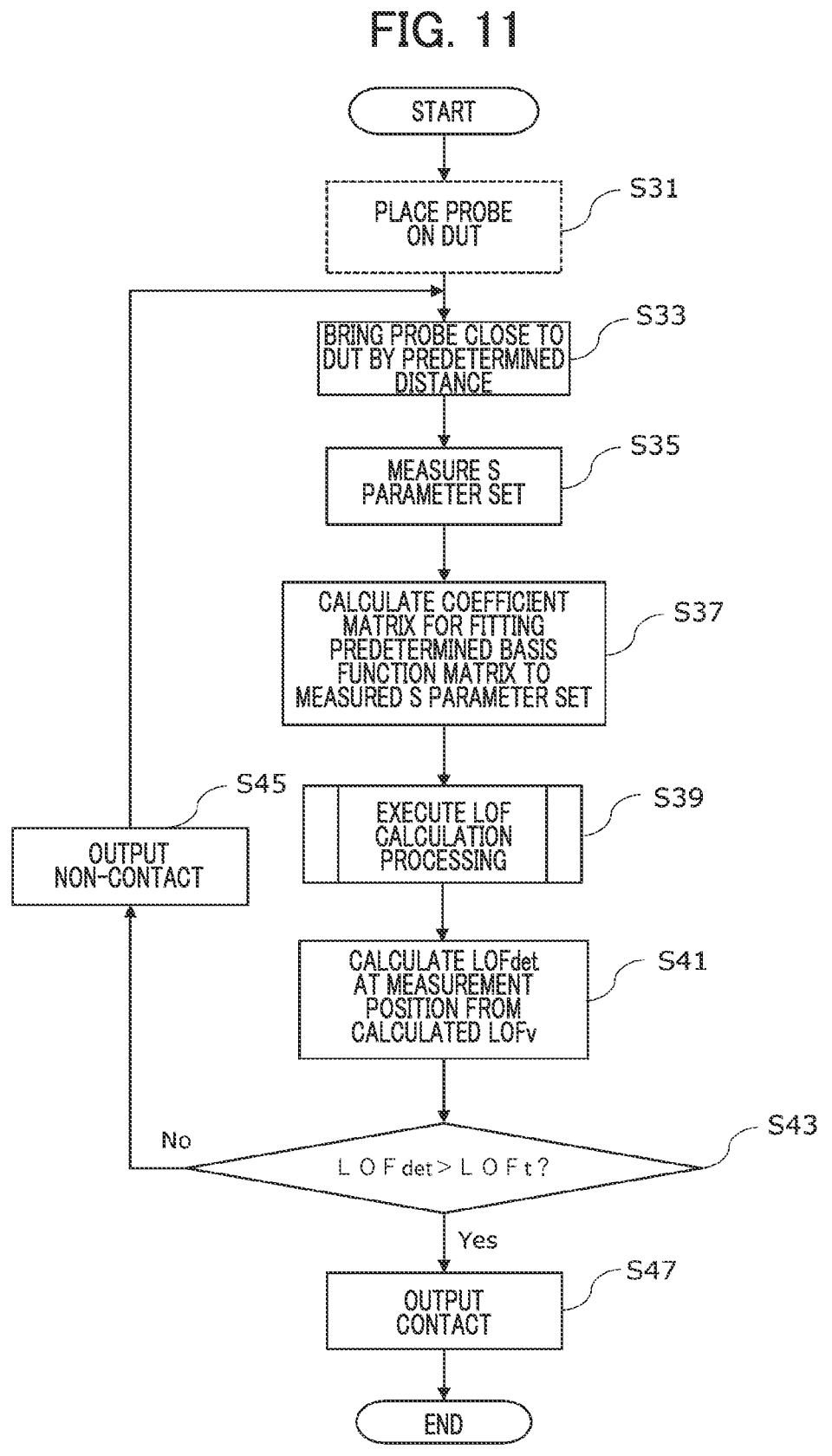

START

PLACE PROBE ON DUT — S31

BRING PROBE CLOSE TO DUT BY PREDETERMINED DISTANCE — S33

MEASURE S PARAMETER SET — S35

CALCULATE COEFFICIENT MATRIX FOR FITTING PREDETERMINED BASIS FUNCTION MATRIX TO MEASURED S PARAMETER SET — S37

EXECUTE LOF CALCULATION PROCESSING — S39

CALCULATE LOFdet AT MEASUREMENT POSITION FROM CALCULATED LOFv — S41

$LOF_{det} > LOF_{t}?$ — S43

OUTPUT NON-CONTACT — S45

No

Yes

OUTPUT CONTACT — S47

END

FIG. 16

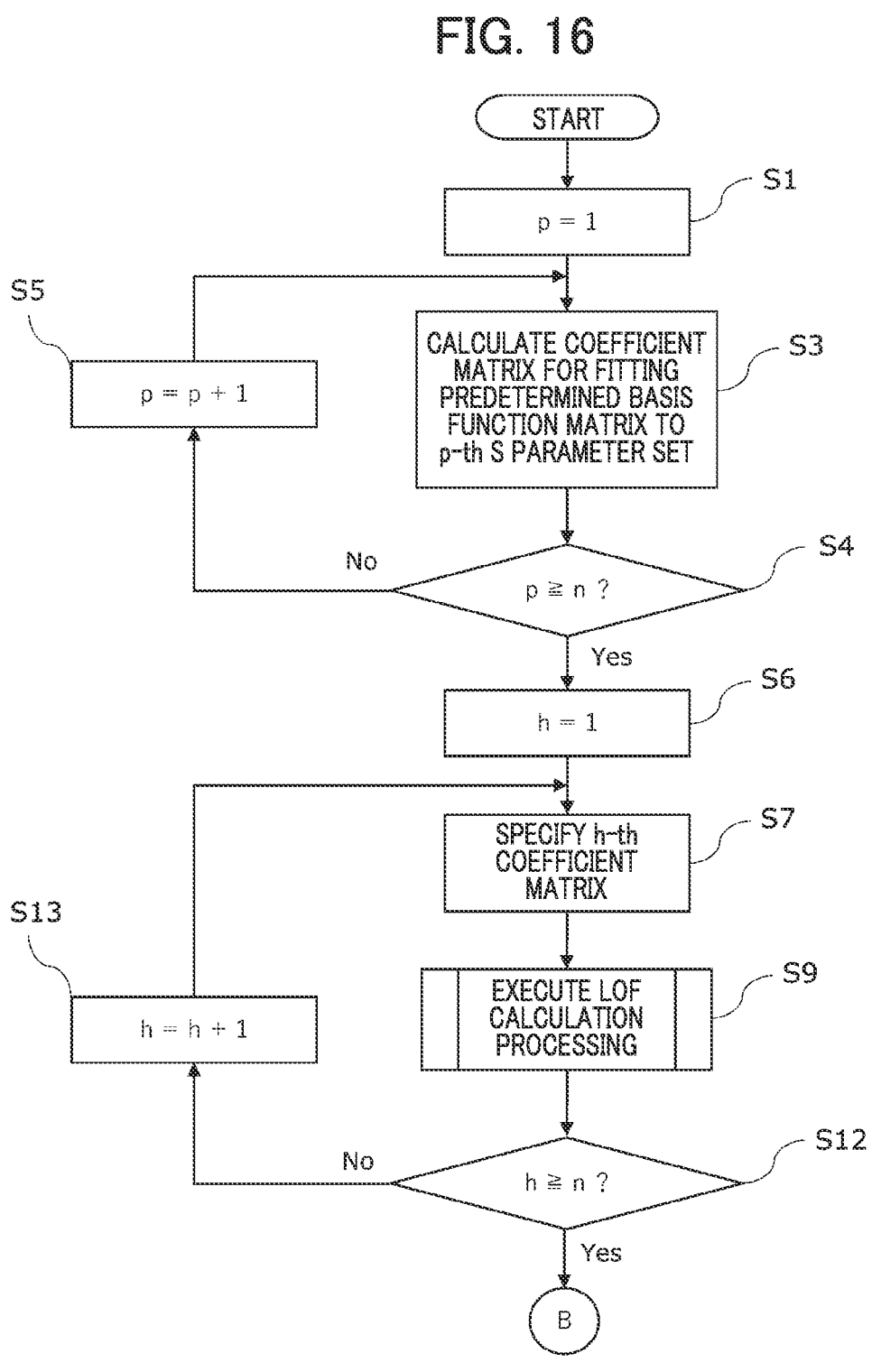

START

S1 — $p = 1$

S5 — $p = p + 1$

S3 — CALCULATE COEFFICIENT MATRIX FOR FITTING PREDETERMINED BASIS FUNCTION MATRIX TO p-th S PARAMETER SET

S4 — $p \geqq n$ ?

No

Yes

S6 — $h = 1$

S7 — SPECIFY h-th COEFFICIENT MATRIX

S13 — $h = h + 1$

S9 — EXECUTE LOF CALCULATION PROCESSING

S12 — $h \geqq n$ ?

No

Yes

Figure 17:
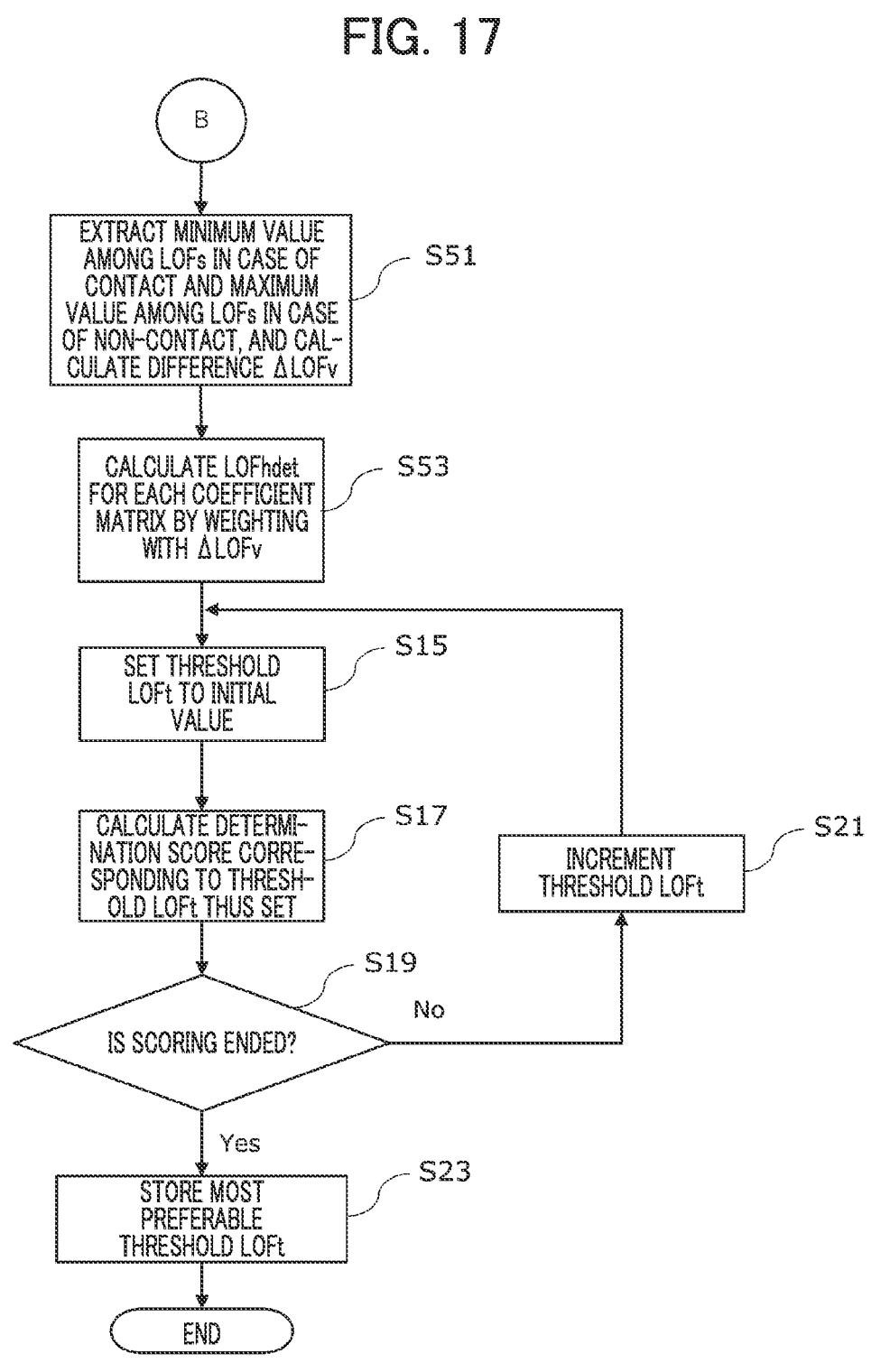

EXTRACT MINIMUM VALUE AMONG LOFs IN CASE OF CONTACT AND MAXIMUM VALUE AMONG LOFs IN CASE OF NON-CONTACT, AND CALCULATE DIFFERENCE $\Delta LOFv$ — S51

CALCULATE LOFhdet FOR EACH COEFFICIENT MATRIX BY WEIGHTING WITH $\Delta LOFv$ — S53

SET THRESHOLD LOFt TO INITIAL VALUE — S15

CALCULATE DETERMINATION SCORE CORRESPONDING TO THRESHOLD LOFt THUS SET — S17

S19 — IS SCORING ENDED?

No

INCREMENT THRESHOLD LOFt — S21

Yes

STORE MOST PREFERABLE THRESHOLD LOFt — S23

END

FIG. 18

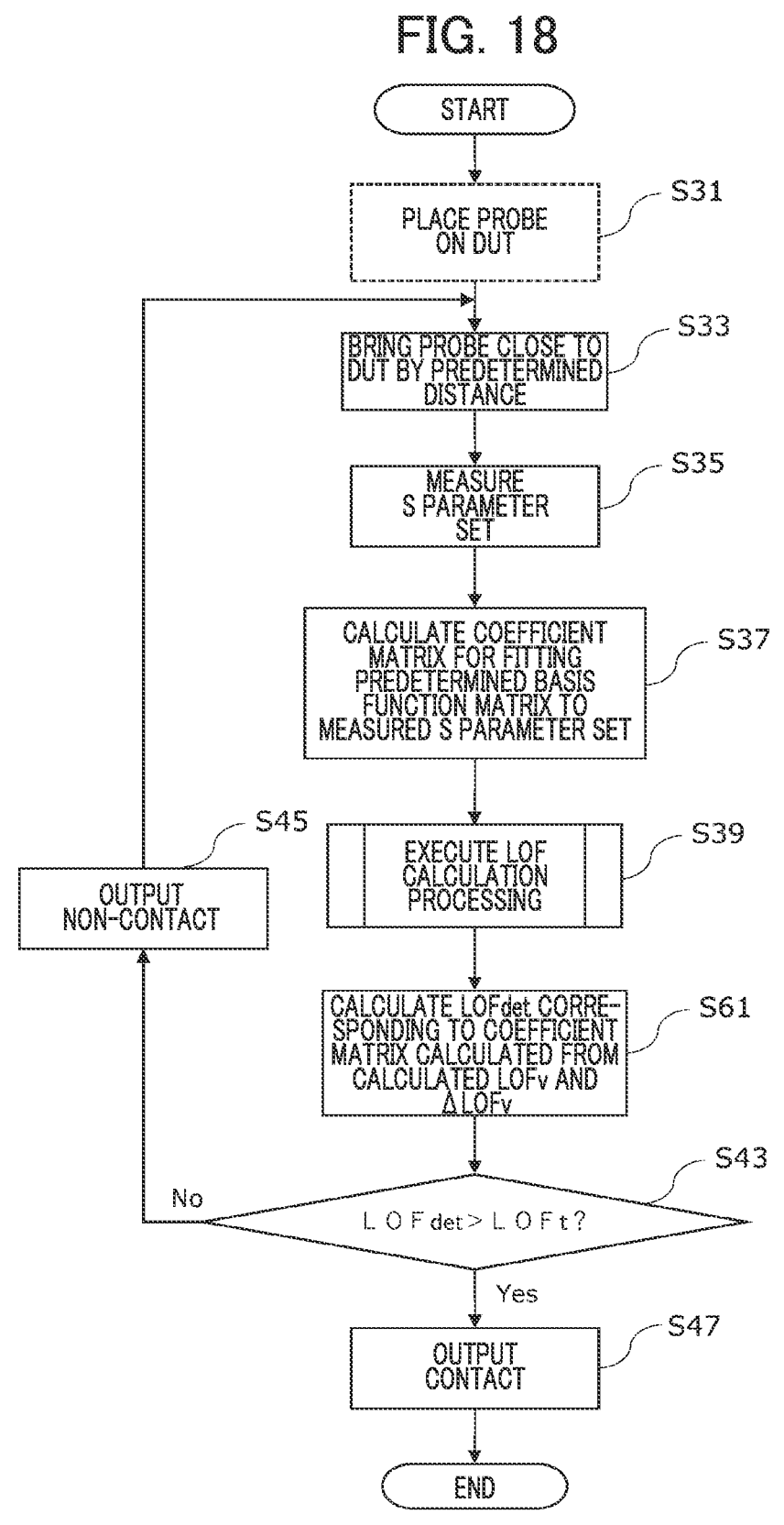

START

S31 — PLACE PROBE ON DUT

S33 — BRING PROBE CLOSE TO DUT BY PREDETERMINED DISTANCE

S35 — MEASURE S PARAMETER SET

S37 — CALCULATE COEFFICIENT MATRIX FOR FITTING PREDETERMINED BASIS FUNCTION MATRIX TO MEASURED S PARAMETER SET

S39 — EXECUTE LOF CALCULATION PROCESSING

S61 — CALCULATE $LOF_{det}$ CORRESPONDING TO COEFFICIENT MATRIX CALCULATED FROM CALCULATED $LOF_v$ AND $\Delta LOF_v$ S43 — $LOF_{det} > LOF_t$ ?

No — S45 — OUTPUT NON-CONTACT

Yes — S47 — OUTPUT CONTACT

END

FIG. 20

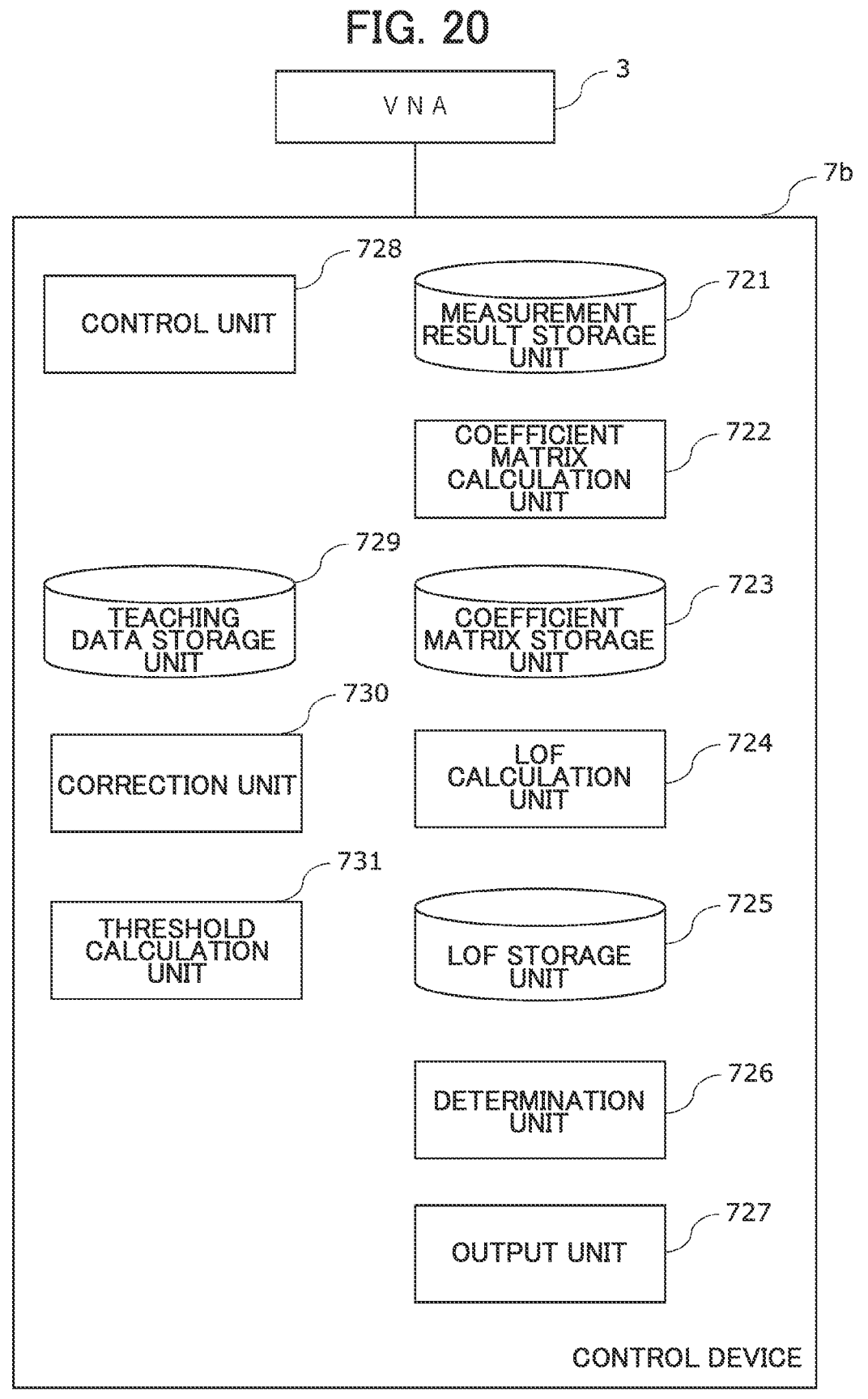

VNA — 3

— 7b

CONTROL UNIT — 728

MEASUREMENT RESULT STORAGE UNIT — 721

COEFFICIENT MATRIX CALCULATION UNIT — 722

TEACHING DATA STORAGE UNIT — 729

COEFFICIENT MATRIX STORAGE UNIT — 723

CORRECTION UNIT — 730

LOF CALCULATION UNIT — 724

THRESHOLD CALCULATION UNIT — 731

LOF STORAGE UNIT — 725

DETERMINATION UNIT — 726

OUTPUT UNIT — 727

CONTROL DEVICE

METHOD FOR DETERMINING CONTACT OR CONNECTION STATE, AND INFORMATION PROCESSING DEVICE

TECHNICAL FIELD

The present invention relates to a technique for determining a contact state of a probe of a measurement device and a connection state of a coaxial connector and a waveguide.

BACKGROUND ART

Fifth-generation and sixth-generation communication technologies have attracted widespread interest from radio-frequency (RF) researchers. Such communication technologies are expected to use frequencies ranging up to 340 GHz (for example, non-patent documents 1 and 2). On-wafer measurement systems are often used to test the performance of planar circuits in millimeter-wave (mmW) frequencies (for example, non-patent documents 3 and 4). These on-wafer measurement systems use an RF probe in contact with a planar circuit to evaluate the electrical properties of the circuit. The impact of the probe contact position has been widely discussed in the past. Although some studies have reported that the probe contact repeatability is negligible in the measurements (for example, non-patent documents 5 to 7), other studies have reported that the probe contact position should be accurately determined, particularly in mmW frequencies (for example, non-patent documents 8 to 11). Image processing is a useful technique for improving the repeatability in the probe contact position (for example, non-patent document 12). The installation of a piezo-actuated nano-positioner is also effective (for example, non-patent document 13). Moreover, a non-contact measurement system has been developed to avoid the impact of probe contact (for example, non-patent document 14).

In this context, the inventors of this application has proposed an automatic probe alignment process using the RF signal detection (RSD) technique (for example, non-patent documents 15 to 19). This alignment technique can improve the probe positional reproducibility in the X-, Y-, and Z-axes, and the probe tilt angle by analyzing the detected RF signal. The RSD technique has been demonstrated in mmW frequencies ranging up to 340 GHz. The RSD technique analyzes the measured S-parameter to determine the probe contact position. For instance, the X-, Y-, and Z-coordinates are determined by detecting the probe touchdown on the contact pad of a planar circuit. The measurement system gradually shifts the probe in each axis direction with the system monitoring the S-parameter until the S-parameter shows a significant change. The standard positions of the probe are determined at the positions where the touchdown is detected. One of the advantages of this technique is that the probe contact position is determined at the apex of the actual contact probe tip, and not at the apex of the probe silhouette (for example, refer to non-patent document 15). Moreover, this technique works well even in a commercial electro-actuating probe station because this technique does not require any additional sensors or high-resolution microscope. The simple scheme of this technique performs robust on-wafer measurements in passive device measurement. Auch an RSD technique can realize stable measurements even in long-term stability tests conducted over a three-month period (for example, refer to non-patent document 20).

Occasionally, however, these techniques do not perform satisfactorily on devices with a complicated structure, such as a device with a dummy-fill structure. FIG. 1(a) shows the S-parameter when the probe is in contact with the dummy-fill, the S-parameter on the gap between the dummy-fill and the contact pad, and the S-parameter on the contact pad. As shown in FIG. 1(b), an error occurs in the probe alignment process because the measured S-parameter changes at the edge of the dummy-fill structure.

In other words, as in the prior art, it is difficult to precisely determine whether a probe is in contact with a contact pad simply based on a change in the S-parameter.

Non-Patent Document 1: Z. Pi and F. Khan, "An introduction to millimeter-wave mobile broadband systems," IEEE Commun. Mag., vol. 49, no. 6, pp. 101-107, June 2011.

Non-Patent Document 2: E. C. Strinati, S. Barbarossa, J. L. G. Jimenez, D. Ktenas, N. Cassiau, L. Maret, and C. Dehos, "6G: The Next Frontier: From Holographic Messaging to Artificial Intelligence Using Subterahertz and Visible Light Communication," IEEE Vehicular Tech. Mag., vol. 14, no. 3, September 2019.

Non-Patent Document 3: K. H. K. Yau, I. Sarkas, A. Tomkins, P. Chevalier, and S. P. Voinigescu, "On-wafer S-parameter de-embedding of silicon active and passive devices up to 170 GHz," in Microwave Symposium Dig., 2010, pp. 600-603.

Non-Patent Document 4: S. Amakawa, A. Orii, K. Katayama, K.takano, M. Motoyoshi, T. Yoshida, and M. Fujishima, "Process parameter calibration for millimeter-wave CMOS back-end device design with electromagnetic field," in 2014 Int. Conf. Microslectronic Test Structures (ICMTS), 2014, pp. 182-187.

Non-Patent Document 5: R. G. Clarke, J. Quraishi, and N. M. Ridler, "A bilateral comparison of on-wafer S-parameter measurement at millimeter wavelengths," in 69th ARFTG Microwave Measurement Conference, 2010, pp. 1-7.

Non-Patent Document 6: D. F. Williams, R. B. Marks, and A. Davidson, "Comparison of on-wafer calibrations," in 38th ARFTG Dig., 1991, pp. 68-81.

Non-Patent Document 7: R. G. Clarke, C. Li, and N. M. Ridler, "An intra-laboratory investigation of on-wafer measurement reproducibility at millimeter-wave frequencies," in 90th ARFTG Microwave Measurement Conference, 2017, pp. 1-6.

Non-Patent Document 8: T. Probst, R. Doerner, M. Ohlrogge, R. Lozar, and U. Arz, "110 GHz on-wafer measurement comparison on alumina substrate," in 90th ARFTG Dig., 2017, pp. 1-4

Non-Patent Document 9: A. M. E. Safwat and L. Hayden, "Sensitivity analysis of calibration standards for SOLT and LRRM," in 58th ARFTG Dig., 2001, pp. 1-10.

Non-Patent Document 10: J. E. Pence, "Verification of LRRM calibrations with load inductance compensation for CPW measurements on GaAs substrates," in 42nd ARFTG Dig., 1993, pp. 45-47.

Non-Patent Document 11: L. Chen, C. Zhang, T. J. Reck, A. Arsenovic, M. Bauwens, C. Groppi, A. W. Lichtenberger, R. M. Weikle, and N. S. Barker, "Terahertz micromachined on-wafer probes: Repeatability and Reliability," IEEE Trans. Microwave Theo. Tech., vol. 60, no. 9, pp. 2894-2902, September 2012.

Non-Patent Document 12: F. T. K. Retzow, T. Tiemerding, P. Elfert, O. C. Haenssler, and S. Fatikow, "Automated calibration of RF on-wafer probing and evaluation of probe misalignment effects using a desktop microfactory," J. Comput. Commun., vol. 4, no. 3, pp. 61-67, March 2016.

Non-Patent Document 13: K. Daffe, G. Dambrine, F. K. Retzow, and K. Haddadi, "RF wafer probing with improved contact repeatability using nanometer positioning," in 87th ARFTG Microwave Measurement Conference, 2016, pp. 1-4.

Non-Patent Document 14: C. Caglayan, G. C. Trichopoulos, and K. Sertel, "Non-Contact Probes for On-Wafer Characterization of Sub-Millimeter-Wave Devices and Integrated Circuits," IEEE Trans. Microwave Theo. Tech., vol. 62, no. 11, pp. 2791-2801, September 2014.

Non-Patent Document 15: R. Sakamaki and M. Horibe, "Realization of accurate on-wafer measurement using precision probing technique at millimeter-wave frequency," IEEE Trans. Inst. Meas., vol. 67, no. 8, pp. 1940-1945, March 2018.

Non-Patent Document 16: R. Skamaki and M. Horibe, "Accuracy Improvement of On-wafer Measurement and Millimeter-wave Frequency by a Full-automatic RF probe-tip Alignment Technique," in 91st ARFTG conference digest, Philadelphia, USA, June 2018, pp. 1-4.

Non-Patent Document 17: R. Sakamaki, M. Horibe, and M. Yoshida, "Transmission loss of screen-printed metallization at millimeter-wave frequency," Electron. Express, vol. 16 no. 3, 20181081, February 2019.

Non-Patent Document 18: R. Sakamaki, M. Horibe, M. Yoshida, and T. Tsurumi, "Demonstration of dielectric measurement using a probe-backside reflection method up to 300 GHz," Jpn. J. Appl. Phys., vol. 58, SLLE02, August 2019

Non-Patent Document 19: R. Sakamaki, and M. Horibe, "Precision adjustment of probe tilt angle with RF signal detection technique," IEEE Trans. Inst. Meas., to be published.

Non-Patent Document 20: R. Sakamaki, and M. Horibe, "Long-term stability test on on-wafer measurement system in NMIJ," in CPEM 2020 Dig., 2020, pp. 1-2.

Non-Patent Document 21: R. Sakamaki and M. Horibe, "Probe Positioner and Probe Tip Calibration for Traceable On-Wafer Measurement," in 92nd ARFTG conference digest, Orlando, USA, January 2019, pp. 1-4.

DISCLOSURE OF THE INVENTION

Problems to be Solved by the Invention

Accordingly, it is an object of the present invention to provide a new technique for enabling to determine whether a probe is in contact with a predetermined object or whether a coaxial connector or a waveguide is in a state of connection failure with a predetermined object.

Means for Solving the Problems

A determination method according to the present invention is directed to a determination method that includes the steps of: (A) measuring an S parameter at a current position of a probe, or at a current connection state of a coaxial connector or a waveguide for a plurality of frequencies; (B) calculating a coefficient matrix for fitting a predetermined function matrix to a frequency characteristic of a measured S parameter; (C) calculating a value of a first local outlier factor based on the coefficient matrix calculated; and (D) determining, based on a relationship between the calculated first local outlier factor and a threshold, whether the probe is in a first state in which the probe is in contact with a predetermined object or in a second state in which the coaxial connector or the waveguide is failed in connection with a predetermined object.

BRIEF DESCRIPTION OF THE DRAWINGS

FIG. 7 is a diagram showing an example of a distribution state of samples on a complex plane;

FIG. 11 is a diagram showing a processing flow of the determination processing according to the first embodiment;

FIG. 16 is a diagram showing a processing flow of preprocessing according to a fourth embodiment;

FIG. 17 is a diagram showing a processing flow of the pre-processing according to the fourth embodiment;

FIG. 18 is a diagram showing a processing flow of a determination processing according to a fourth embodiment;

FIG. 20 is a functional block diagram of a control device according to the fifth embodiment;

PREFERRED MODE FOR CARRYING OUT THE INVENTION

Embodiment 1

Figure 1A:
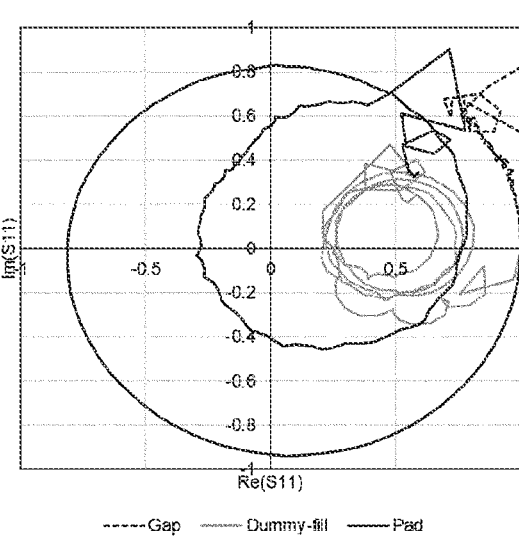
FIG. 1 is diagrams for explaining a conventional problem.
Figure 1B:
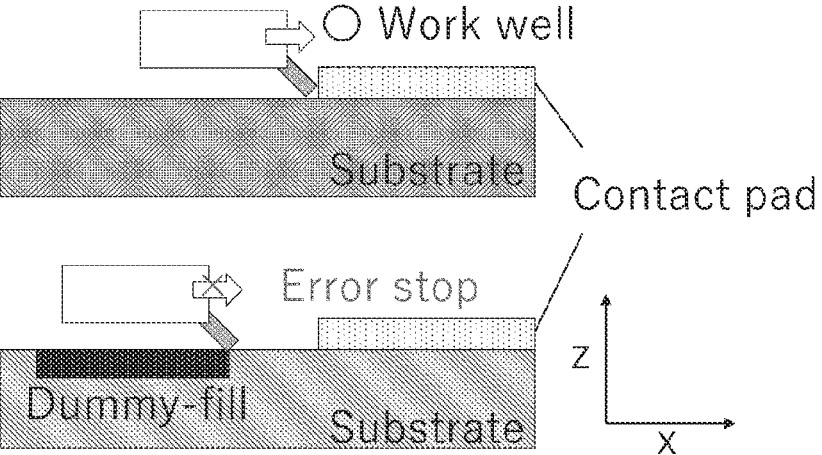
Figure 2:
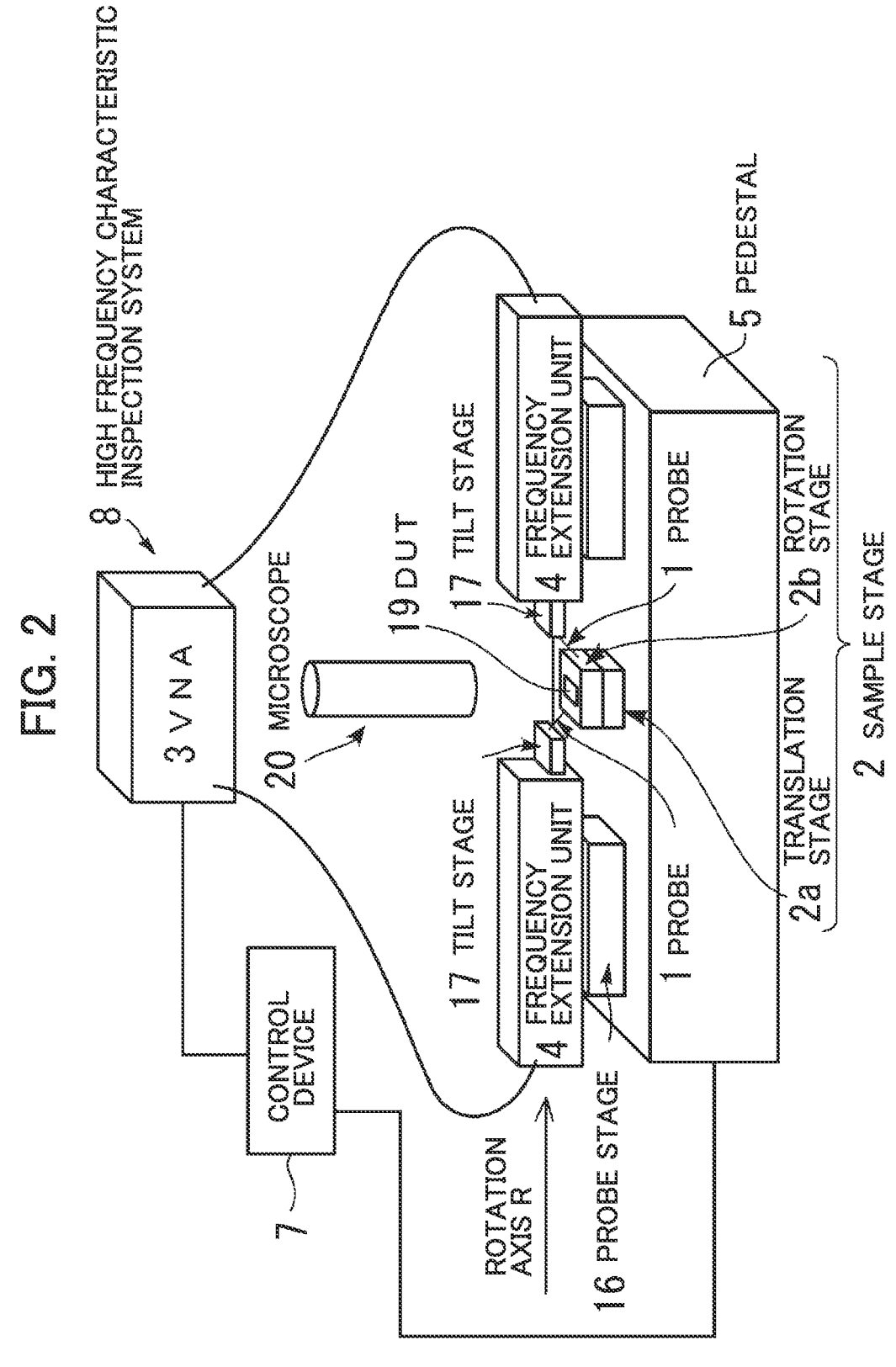
FIG. 2 is a diagram showing an outline of the whole system according to an embodiment.

FIG. 2 shows a configuration example of a high-frequency characteristic inspection system according to an embodiment of the present invention.

The high-frequency characteristic inspection system 8 according to the present embodiment includes a control device 7, a vector network analyzer (VNA) 3, a sample stage 2, a pair of probes 1, a pair of tilt stages 17, a pair of frequency expansion units 4, a pair of probe stages 16, a pedestal 5, and a microscope 20.

The VNA 3 outputs a high-frequency signal for evaluating the electrical characteristics of a DUT 19, receives a transmission signal and a reflection signal from the DUT 19, and performs predetermined analysis processing.

The sample stage 2 is disposed on the pedestal 5, and has a flat mounting surface on which the DUT 19 is mounted. Furthermore, the sample stage 2 includes a translation stage 2a that can translate the mounting surface in the X-axis direction, the Y-axis direction, and the Z-axis direction, and a rotation stage 2b that can rotate the mounting surface around the rotation axis R. The X-axis direction and the Y-axis direction of the translation stage 2a are not affected by the rotation of the rotation stage 2b.

The pair of probes 1 are disposed on the tilt stages 17 and opposed to each other with the sample stage 2 interposed therebetween. The probes 1 each have at least one signal terminal (S terminal) and at least one ground terminal (G terminal).

By rotating the probe 1 about the rotation axis R, the inclination of the reference line L with respect to the measurement surface of the DUT is adjusted. The rotation angle of the probe 1 about the rotation axis R is a tilt angle (also referred to as a probe angle).

The pair of frequency expansion units 4 are disposed on the probe stages 16 and opposed to each other with the sample stage 2 interposed therebetween. The frequency expansion units 4 each expand the frequency of the signal inputted from the VNA 3 and outputs the signal to the signal terminal. The frequency expansion units 4 are each used to output a signal having a frequency that cannot be generated by the VNA 3. The pair of tilt stages 17 are fixed to the frequency expansion units 4 and opposed to each other. It should be noted that the function of the frequency expansion unit 4 is included in the VNA 3.

The pair of probe stages 16 are disposed on the pedestal 5 and opposed to each other with the sample stage 2 interposed therebetween. The probe stage 16 can translate the frequency expansion unit 4 in the X-axis direction, the Y-axis direction, and the Z-axis direction. The movement of the frequency expansion unit 4 allows the position of the probe 1 to be moved.

The control device 7 controls the operation of the VNA 3, the sample stage 2, the tilt stage 17, and the probe stage 16. The control device 7 may be implemented by a computer or a dedicated circuit, for example.

The microscope 20 is used, for example, to determine a positional relationship between a DUT or the like placed on a mounting surface of the sample stage 2 and the probe 1.

Figure 3:
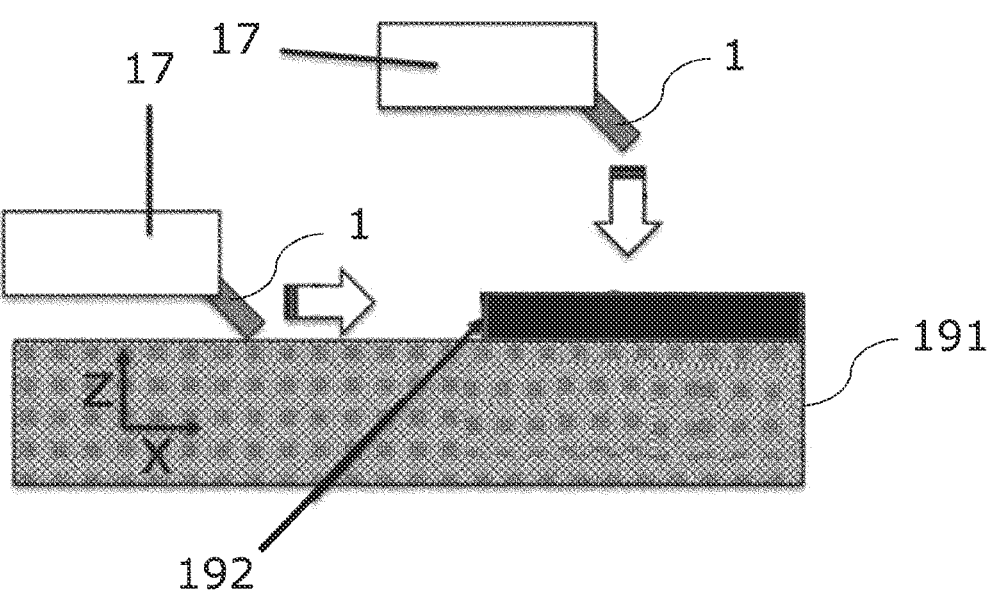
FIG. 3 is a diagram for explaining movement of a probe.

For example, as shown in FIG. 3, there is a case in which the probe 1 is relatively moved in the x-axis direction on a substrate 191 to make contact with a contact pad 192 on the substrate 191, or a case in which the probe 1 is relatively lowered in the z-axis direction to make contact with the contact pad 192 on the substrate 191.

First, pre-processing will be described with reference to FIGS. 4 to 9. The pre-processing refers to processing for generating in advance the data used for performing processing for determining whether or not the probe 1 has been brought into contact with the contact pad 192 by actually moving the probe 1.

Figure 4:
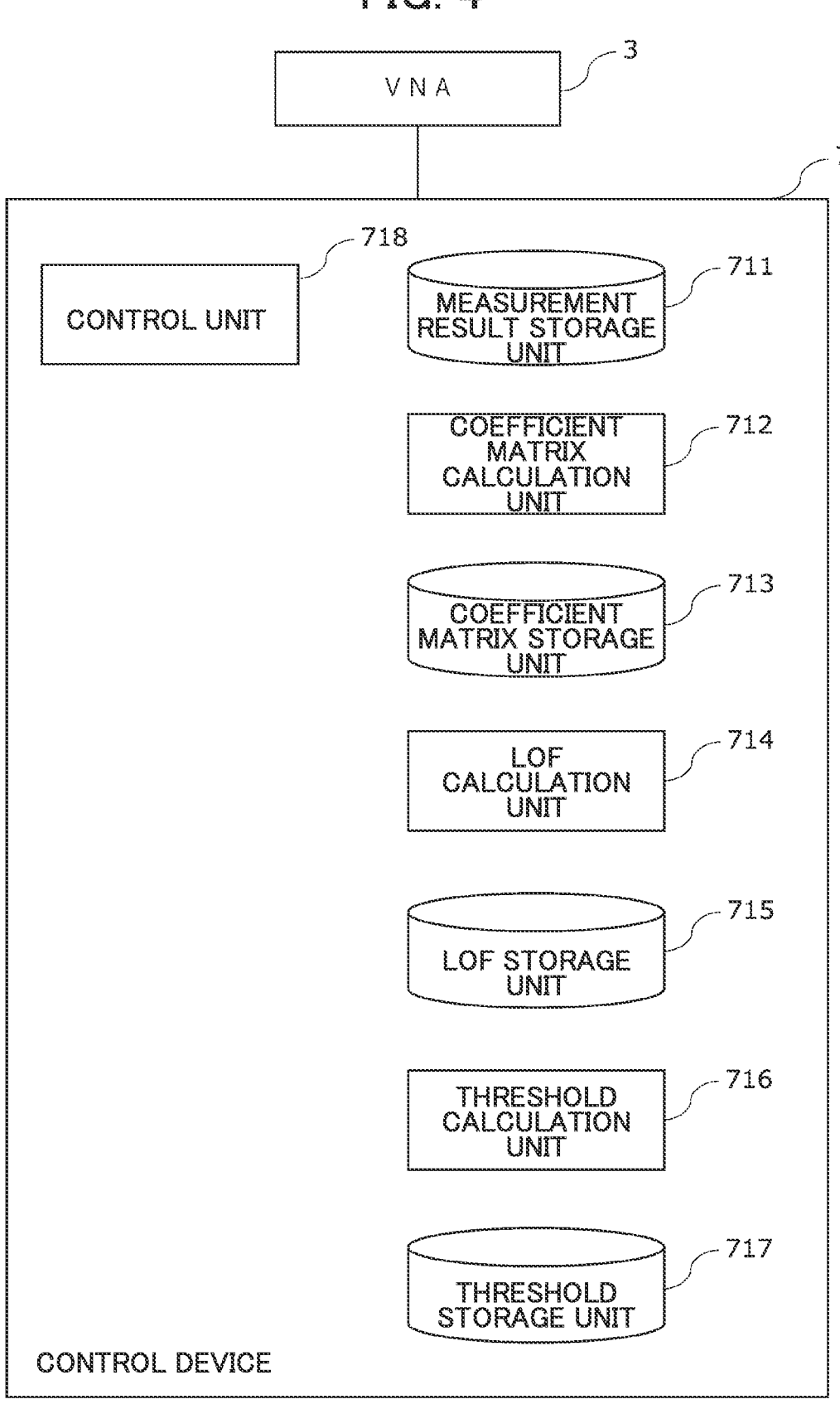
FIG. 4 is a functional block diagram of a control device for preprocessing.

FIG. 4 shows a functional configuration example of the control device 7 that executes the pre-processing. The control device 7 executing the pre-processing includes a measurement result storage unit 711, a coefficient matrix calculation unit 712, a coefficient matrix storage unit 713, a LOF (Local Outlier Factor) calculation unit 714, a LOF storage unit 715, a threshold calculation unit 716, a threshold storage unit 717, and a control unit 718.

The control unit 718 controls the VNA 3, the sample stage 2, the probe stage 16 and the like in accordance with, for example, an instruction from the user, and stores data of the measurement result (S parameter) received from the VNA 3 in the measurement result storage unit 711. In the present embodiment, for example, the control unit 718 gradually lowers the probe 1 to the contact pad 192. Here, in a case of non-contact, the tag non-contact is stored in the measurement result storage unit 711 in association with an S parameter (e.g., reflection coefficient) as a measurement result, and in a case of contact, the tag "contact" is stored in the measurement result storage unit 711 in association with the S parameter as the measurement result. Whether it is contact or non-contact is confirmed by using the microscope 20 or a conventional technique. The processing of measuring the probe 1 until it comes into contact with the contact pad 192 while gradually lowering the probe 1 is performed a plurality of times. More specifically, a plurality of non-contact measurement results are stored in the course of gradually lowering the probe 1, one or a plurality of measurement results when the probe 1 comes into contact with the contact pad 192 (in the case of "contact") are stored, and a plurality of sets of such "non-contact" and "contact" measurement results are stored. As for the S parameter, the S parameter at a plurality of frequencies in a predetermined frequency band is measured at one measurement position. In the present embodiment, the S parameter at a plurality of frequencies is referred to as an S parameter set. Furthermore, other coefficients rather than the reflection coefficient may be included. The measurement result stored in the measurement result storage unit 711 is teaching data for the S parameter.

The coefficient matrix calculation unit 712 calculates a coefficient matrix for fitting, for example, a basis function matrix including a plurality of trigonometric functions to each measurement result, and stores the coefficient matrix in the coefficient matrix storage unit 713. The LOF calculation unit 714 calculates the value of the local outlier factor LOF using the coefficient matrix of each measurement result stored in the coefficient matrix storage unit 713, and stores the value in the LOF storage unit 715 in association with "contact" or "non-contact" of the measurement result. The threshold calculation unit 716 calculates a threshold of the LOF for discriminating whether it is contact or non-contact, using the data stored in the LOF storage unit 715, and stores the calculated threshold in the threshold storage unit 717.

Next, with reference to FIGS. 5A to 9, the processing contents of the control device 7 that executes the pre-processing will be described. It should be noted that the measurement itself is the processing as described in relation to the control unit 718, and the measurement result is already stored in the measurement result storage unit 711, and thus a description thereof will be omitted.

Figure 5A:
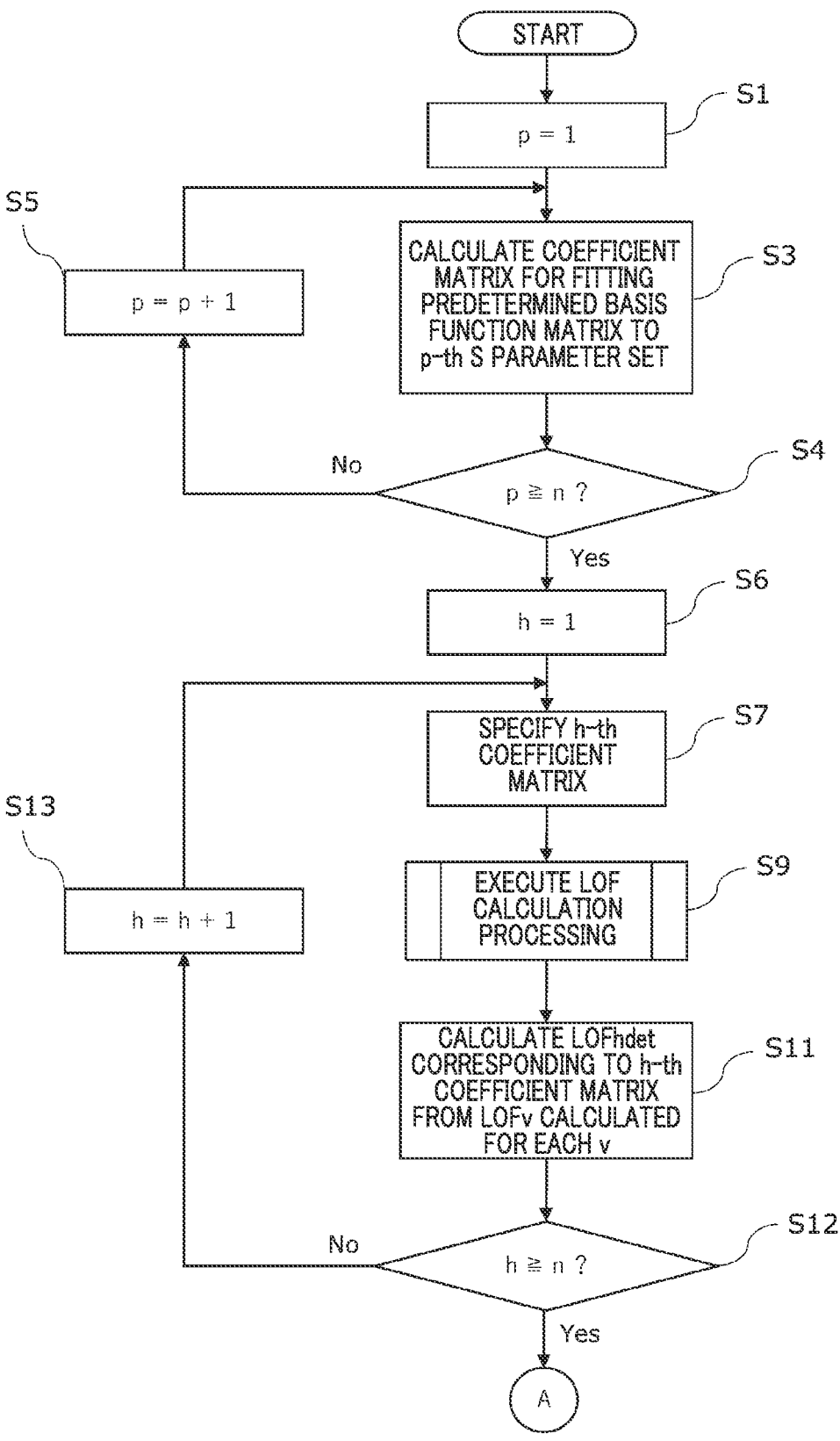
FIG. 5A is a diagram showing a processing flow of the preprocessing according to a first embodiment.

First, the coefficient matrix calculation unit 712 initializes the counter p to 1 (FIG. 5A: Step S1). The counter p is a counter for the S parameter set, where there are n number of S parameter sets. Then, the coefficient matrix calculation unit 712 calculates a coefficient matrix for fitting a predetermined basis function matrix to the p-th S parameter set, and stores the coefficient matrix in the coefficient matrix storage unit 713 (Step S3). Step S3 is executed, for example, for each of the real part and the imaginary part of the reflection coefficient. Furthermore, the tag "contact" or "non-contact" attached to the p-th S parameter set is stored in association with the calculated coefficient matrix.

In the present embodiment, the basis function matrix $\varphi(x)$, which is a function of the frequency x, is a matrix of b×1 type including a plurality of trigonometric functions as matrix components, and the relationship with the coefficient matrix $\theta$ is expressed as follows. It should be noted that a relationship of b=2m+1 is established between m and b in the following equation (1). Hereinafter, each function on the right side of the equation (1) is referred to as a basis function of the first order to the b-th order (=2m+1) in order from the left, and coefficients corresponding to these basis functions are referred to as expansion coefficients of the first order to the b-th order (=2m+1), respectively.

$$\varphi(x) = \left(1, \sin\frac{x}{2}, \cos\frac{x}{2}, \sin\frac{2x}{2}, \cos\frac{2x}{2}, \ldots, \sin\frac{mx}{2}, \cos\frac{mx}{2}\right)^T \quad (1)$$

$$f_\theta(x) = \sum_{j=1}^{b} \theta_j \varphi_{j(x)} = \theta^T \varphi(x) \quad (2)$$

It should be noted that $\varphi_j(x)$ represents the j-th component of $\varphi(x)$. $F_\theta(x)$ represents the value of the S parameter at frequency x calculated using the coefficient matrix $\theta$. $\theta_j$ represents the j-th component among b pieces of components of the coefficient matrix $\theta$. Since the coefficient matrix $\theta$ is optimized, for example, by the linear least squares method as shown below, in the optimized stage, $f_\theta(x)$ represents a value obtained by fitting the actual measured value of the S parameter at the frequency x with the basis function matrix $\varphi(x)$. In addition, the number of frequencies at which the S parameter is measured is Nx.

In the linear least squares method, since the mathematical operation is performed so as to minimize the square of the error for each frequency, the following evaluation function $J_{LS}(\varphi)$ is defined.

$$J_{LS}(\varphi) = \frac{1}{2}\sum_{i=1}^{Nx}(f_\theta(x_i) - S_i)^2 = \frac{1}{2}\|\Phi\theta - S\|^2 \quad (3)$$

Herein, S is an Nx×1 matrix including values of S parameters (e.g., reflection coefficients) at Nx frequencies, and $S_i$ represents values of S parameters at the i-th frequency. $\Phi$ is an Nx×b matrix including Nx rows of $\Phi(x)$ including b pieces of components.

When the evaluation function $J_{LS}(\varphi)$ of equation (3) reaches a minimum, the first order partial differential for $\theta$ becomes zero. That is, it is expressed as follows.

$$\nabla_\theta J_{LS} = \left(\frac{\partial J_{LS}}{\partial \theta_1}, \ldots, \frac{\partial J_{LS}}{\partial \theta_b}\right)^T = \Phi^T \Phi \theta - \Phi^T S = 0 \quad (4)$$

Based on equation (4), the optimized $\theta$, $\theta_{LS}$, is obtained by calculating the following equation.

$$\theta_{LS} = \Phi^\dagger S = (\Phi^T \Phi)^{-1} \Phi^T S \quad (5)$$

The cross marks arranged at the top right of the matrix represent generalized inverse matrices.

By executing such a mathematical operation, a coefficient matrix $\theta_{LS,real}$ for the real part and a coefficient matrix $\theta_{LS,imag}$ for the imaginary part are obtained, and these matrixes are b×1 matrixes. Hereinafter, a coefficient matrix obtained by combining two matrices is referred to as a coefficient matrix $\theta_{LS}$ The component $\theta_{LS,v}$ of the v-th order (that is, the v-th line) of the coefficient matrix $\theta_{LS}$ is a expansion coefficient for the v-th order basis function, and $\theta_{LS,v}$ is a complex number. In the subsequent processing, the distance between expansion coefficients for each order is calculated for two different S parameter sets, and this distance is defined using $\theta_{LS,v} = \theta_{LS,real,v} + \theta_{LS,imag,v}$, which is a complex notation of $\theta_{LS,v}$. Specifically, for example, when $\theta_{LS,v}$ obtained for the first S parameter set is denoted as $\theta_{LS,v}^{(1)}$, and $\theta_{LS,v}$ obtained for the second S parameter set is denoted as $\theta_{LS,v}^{(2)}$, the following equations are expressed.

$$\theta_{LS,v}^{(1)} = \theta_{LS,real,v}^{(1)} + i\theta_{LS,imag,v}^{(1)}$$

$$\theta_{LS,v}^{(2)} = \theta_{LS,real,v}^{(2)} + i\theta_{LS,imag,v}^{(2)}$$

This distance can be calculated by the following equation.

$$\left|\theta_{LS,v}^{(1)} - \theta_{LS,v}^{(2)}\right| = \sqrt{\left(\left(\theta_{LS,real,v}^{(1)} - \theta_{LS,real,v}^{(2)}\right)^2 + \left(\theta_{LS,imag,v}^{(1)} - \theta_{LS,imag,v}^{(2)}\right)^2\right)} \quad (6)$$

It should be noted that the distance may be defined as something other than the Euclidean distance.

Figure 6A:
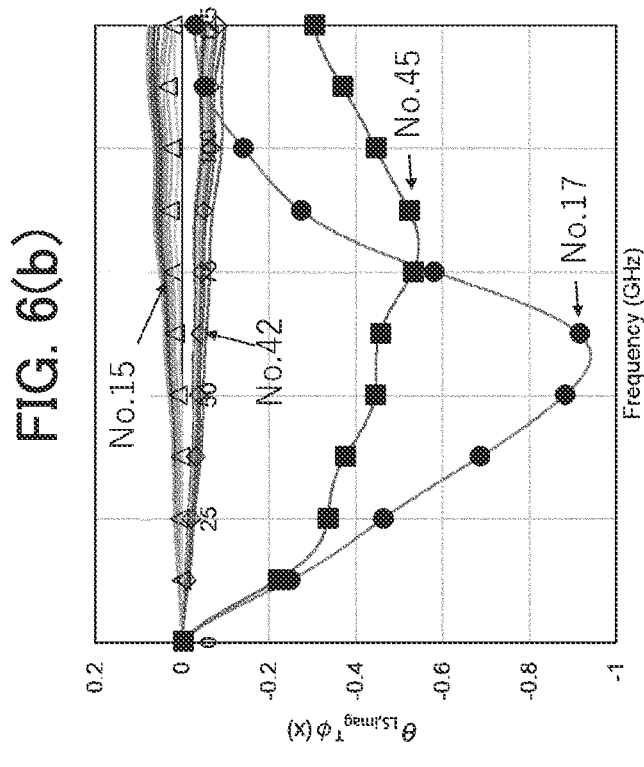
FIGS. 6(a) and 6(b) are diagrams for explaining an example of fitting according to the first embodiment.
Figure 6B:
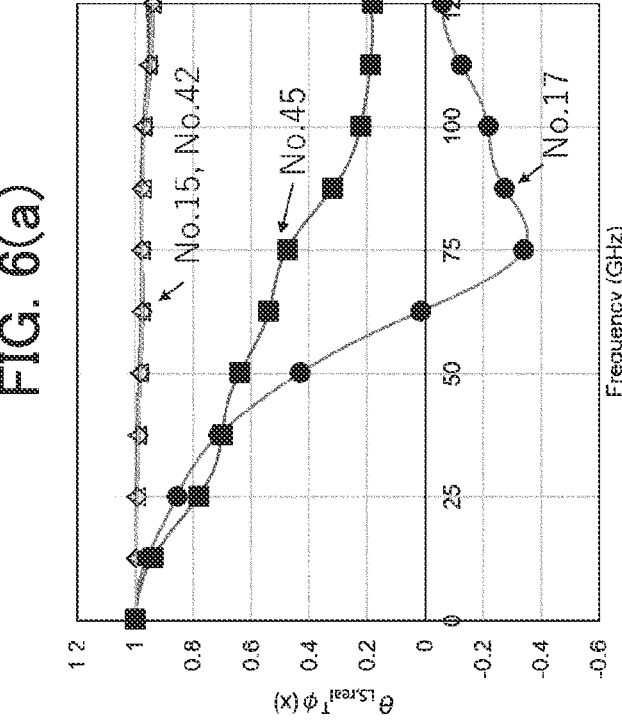

Fitting in Step S3 will be briefly described with reference to FIG. 6. FIG. 6(a) shows the relationship between the measurement result of the real part of the frequency and the reflection coefficient and the result of fitting ($\theta_{LS, real}^T \varphi(x)$) and FIG. 6(b) shows the relationship between the measurement result of the imaginary part of the frequency and the reflection coefficient and the result of fitting ($\theta_{LS, imag}^T \varphi(x)$). In FIGS. 6(a) and 6(b), a point represents a measurement result, and a curve substantially along the point represents a fitting result. In both cases, the 45th measurement result and the 17th measurement result represent the case of "contact", and the other measurement results represent the case of "non-contact". In this example, it can be seen that fitting is successful.

When the coefficient matrix $\theta_{LS}$ is calculated for one S parameter set, the coefficient matrix calculation unit 712 determines whether or not the value of the counter p is equal to or greater than the number n of S parameter sets (Step S4). When the value of the counter p is less than n (Step S4: No), the coefficient matrix calculation unit 712 increments p by 1, and the processing returns to Step S3. On the other hand, when the value of the counter p becomes equal to or greater than n (Step S4: Yes), the LOF calculation unit 715 initializes the value of the counter h of the coefficient matrix to 1 (Step S6). There are n number of coefficient matrices that are the same as the number of S parameter sets. Furthermore, in the coefficient matrix storage unit 713, the LOF calculation unit 715 specifies the h-th coefficient matrix as a coefficient matrix of interest (Step S7). Here, the h-th coefficient matrix is denoted as $\theta^h_{LS}$.

Furthermore, the LOF calculation unit 715 executes LOF calculation processing for the coefficient matrix of interest (Step S9). The LOF calculation processing will be described with reference to FIG. 5B. The LOF calculation unit 715 initializes the counter v of the row in the coefficient matrix to 1 (FIG. 5B: Step S201). Since the coefficient matrix is a b×1 matrix, the number of rows is b. In the complex plane, the LOF calculation unit 715 specifies neighboring k pieces of v-th order components in the other coefficient matrices around the v-th order components in the coefficient matrix of interest (Step S203). K is a predetermined constant. The v-th order component of the coefficient matrix of interest is denoted by $\theta^h_{LS,v}$, and the neighboring k pieces of v-th order components in the other coefficient matrices are denoted by $\theta^{h,i}_{LS,v}$ (i=1 to k).

Then, the LOF calculation unit 715 calculates LOF V, which is a LOF for the v-th order component in the coefficient matrix of interest, using the v-th order component in the coefficient matrix of interest, the neighboring k pieces of v-th order components in the other coefficient matrices, and the like (Step S205).

Here, the distance between A and B is denoted by d(A, B), and the distance between the sample k-th closest to A and A is denoted by k-distance(A). The reachability distance reachdist(A,B) between A and B is defined as follows. It should be noted that max(A,B) is a function that outputs a larger value of A and B.

$$\text{reachdist}(A,B)=\max(d(A,B),k\text{-distance}(B))$$

Furthermore, when a group of neighboring k pieces of samples of A is N(A), an average RD(A) of reachability distances between A and N(A) is expressed as follows.

$$RD(A)=\{\Sigma_{C\in N(A)}\text{reachdist}(A,C)\}/k$$

Furthermore, the local reachability density (LRD) is expressed as follows.

$$LRD(A)=1/RD(A)$$

The local outlier factor LOF(A) for A is then expressed as:

$$LOF(A)=\Sigma_{C\in N(A)}LRD(C)/(k\times LRD(A)).$$

When this is applied to the present embodiment, A is $\theta^h_{LS,v}$, and N(A) is $\theta^{h,i}_{LS,v}$ (i=1 to k). The average $RD(\theta^h_{LS,v})$ of the reachability distances and the local reachability density $LRD(\theta^h_{LS,v})$ are expressed as follows.

$$RD(\theta^h_{LS,v}) = \frac{1}{k}\sum_{i=1}^{k}\text{reachdist}(\theta^h_{LS,v}, \theta^{h,i}_{LS,v}) \tag{7}$$

$$LRD(\theta^h_{LS,v}) = 1/RD(\theta^h_{LS,v})$$

Then, $LOF(\theta^h_{LS,v})$ is calculated according to the following equation.

$$LOF(\theta^h_{LS,v}) = \frac{\frac{1}{k}\sum_{i=1}^{k}LRD(\theta^{h,i}_{LS,v})}{LRD(\theta^h_{LS,v})} \tag{8}$$

By doing so, $LOF_v=LOF(\theta^h_{LS,v})$ of the v-th order component $\theta_{LS,v}$ of the coefficient matrix of interest is calculated.

Figure 7:
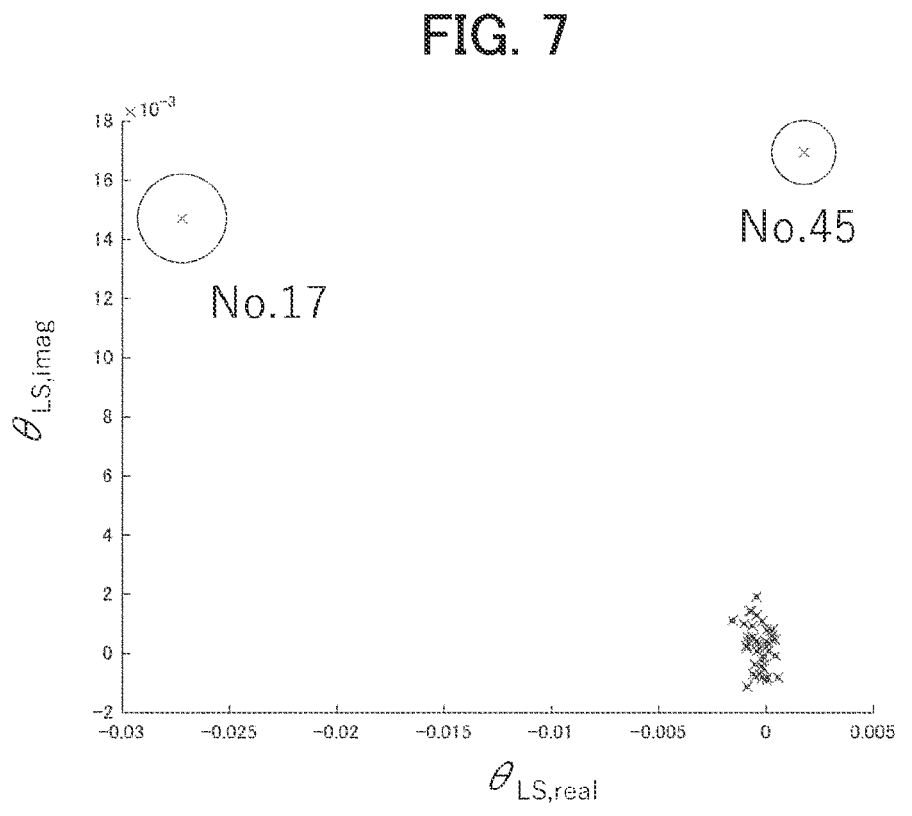

FIG. 7 shows an example of LOF V calculation. FIG. 7 shows a complex plane, and each point corresponds to the v-th order component in the coefficient matrix. Similarly to FIG. 6, the point corresponding to the v-th order component of the 45th coefficient matrix and the point corresponding to the v-th order component of the 17th coefficient matrix indicate the case of "contact", and are clearly located apart from the other points in the case of "non-contact". The diameter of a circle surrounding the point corresponding to the v-th order component of the 45th coefficient matrix and the point corresponding to the v-th order component of the 17th coefficient matrix represents the LOF V calculated for each of them.

Then, the LOF calculation unit 715 determines whether or not the value of the counter v is equal to or greater than b (Step S207). When the value of the counter v is less than b (Step S207: No), the LOF calculation unit 715 increments v by 1 and the processing returns to Step S203 (Step S209). On the other hand, when the value of the counter v is equal to or greater than b (Step S207: Yes), the processing returns to the calling source processing.

Returning to the description of the processing of FIG. 5A, the LOF calculation unit 715 calculates $LOF^h_{det}$ corresponding to the h-th coefficient matrix from the $LOF_v$ calculated for each v, and stores the $LOF^h_{det}$ in the LOF storage unit 716 (Step S11). In the present embodiment, $LOF_{det}$ is calculated by the following mathematical operation.

$$LOF^h_{det}=\text{mean}(LOF(\theta^h_{LS,v})) \tag{9}$$

"Mean" represents a function for calculating an average. It should be noted that a tag of "contact" or "non-contact" attached to the coefficient matrix of interest is stored in $LOF^h_{det}$ in association with each other.

Then, the LOF calculation unit 715 determines whether or not the value of the counter h is equal to or greater than n (Step S12). When the value of the counter h is less than n (Step S12: No), the LOF calculation unit 715 increments h by 1 and the processing returns to step S7 (Step S13). On the other hand, when the value of the counter h is equal to or greater than n (Step S12: Yes), the processing proceeds to the processing of FIG. 8 via the terminal A.

Figure 8:
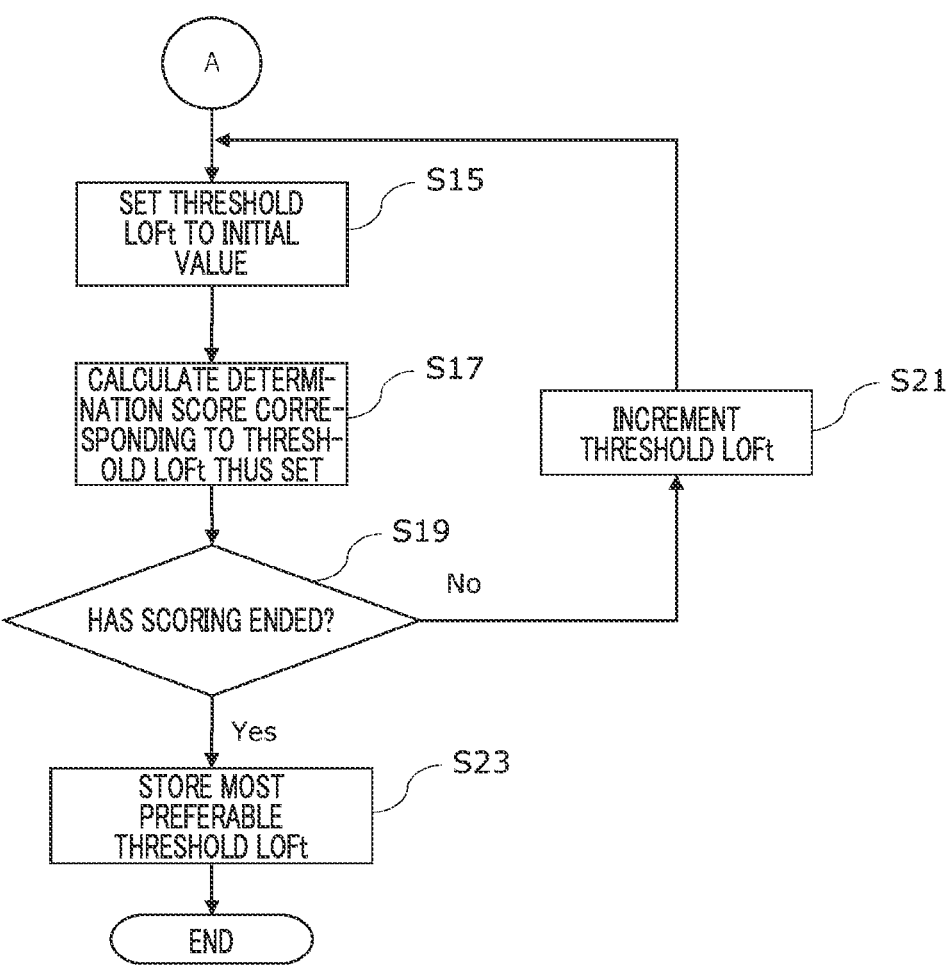
FIG. 8 is a diagram showing a processing flow of the preprocessing according to the first embodiment.

When the processing of FIG. 5A is shifted to the terminal A, the threshold calculation unit 716 sets an initial value for the threshold $LOF_t$ (FIG. 8: Step S15). In the present embodiment, the threshold $LOF_t$ is gradually increased to search for a preferable threshold $LOF_t$ on the assumption that $LOF^h_{det}$ is larger in the case of contact than in the case of non-contact. When the threshold $LOF_t<LOF^h_{det}$ is satisfied, it is determined as contact, and when the threshold $LOF_t\geq LOF^h_{det}$, it is determined as non-contact.

The threshold calculation unit 716 calculates a determination score corresponding to the set threshold $LOF_t$ (Step S17). For example, when the processing of measuring the probe 1 until it comes into contact with the contact pad 192 while gradually lowering the probe 1 is performed a plurality of times, the determination result at the threshold $LOF_t$ is scored for a set of measurement results in each approach to the contact pad 192 of the probe 1. For example, for each approach, score "3" is given if contact and non-contact can be completely discriminated, score "2" is given if there is one determination miss, score "1" is given if there are two determination misses, score "0" is given if there are three or more misses, and scores for all approaches are summed. Such scoring is an example, and other methods may be used for scoring. For example, not only the approach, but also the number of the contact and the non-contact erroneously discriminated may be scored on the basis of the score.

The threshold calculation unit 716 determines whether or not a scoring end event, for example, in which the threshold $LOF_t$ exceeds a predetermined value, has occurred (Step S19). When a preferable range of the threshold $LOF_t$ is known, it may be determined whether or not the threshold $LOF_t$ has reached the upper limit. When the scoring is not finished, the threshold calculation unit 716 increments the threshold $LOF_t$ by a predetermined value (Step S21). Then, the processing returns to Step S15.

On the other hand, when scoring is finished, the threshold calculation unit 716 stores the threshold $LOF_t$ with the best score in the threshold storage unit 717 (Step S23). Then, the processing ends.

When the threshold $LOF_t$ is used to determine contact and non-contact at each position of the probe 1, not only the threshold LOF t, but also the coefficient matrix $\theta_{LS}$ is used. Therefore, these data are stored in the control device 7 of the high-frequency characteristic inspection system 8 for determining contact and non-contact.

Figure 9:
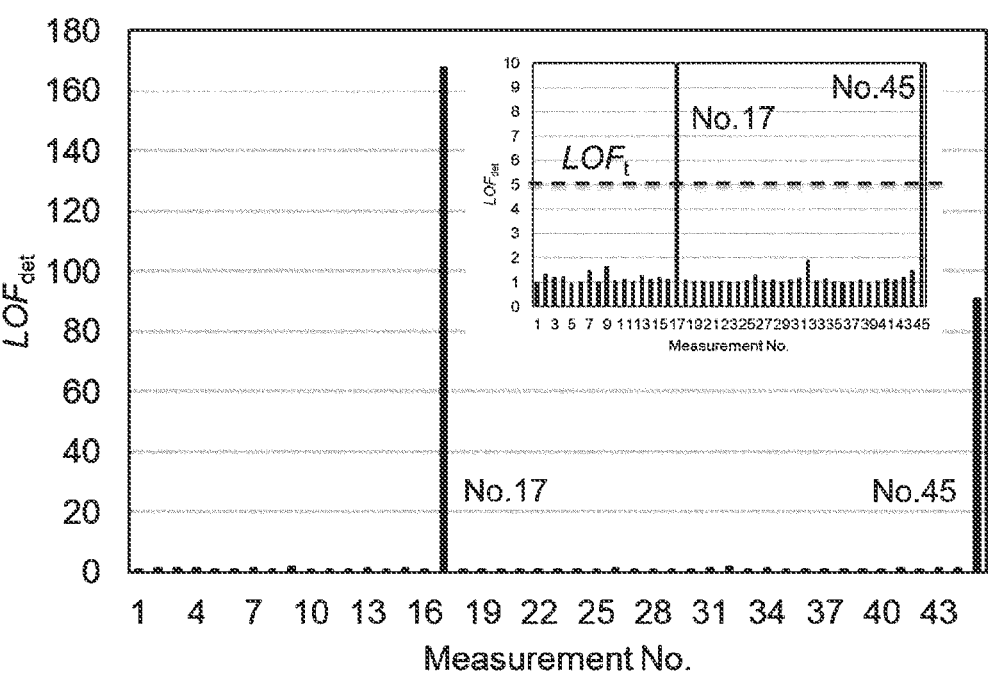
FIG. 9 is a diagram showing a calculation example of $LOF_{det}$ according to the first embodiment.

FIG. 9 shows an example of the calculation result of $LOF^h{}_{det}$. In the example described above, $LOF^h{}_{det}$ of the 17th measurement result and the 45th measurement result indicating the case of contact are very high, while the $LOF^h{}_{det}$ of the other measurement results indicating the case of non-contact are mostly $LOF^h{}_{det}$<2. Therefore, it is understood that contact and non-contact can be clearly discriminated by appropriately setting the threshold $LOF_t$.

Figure 10:
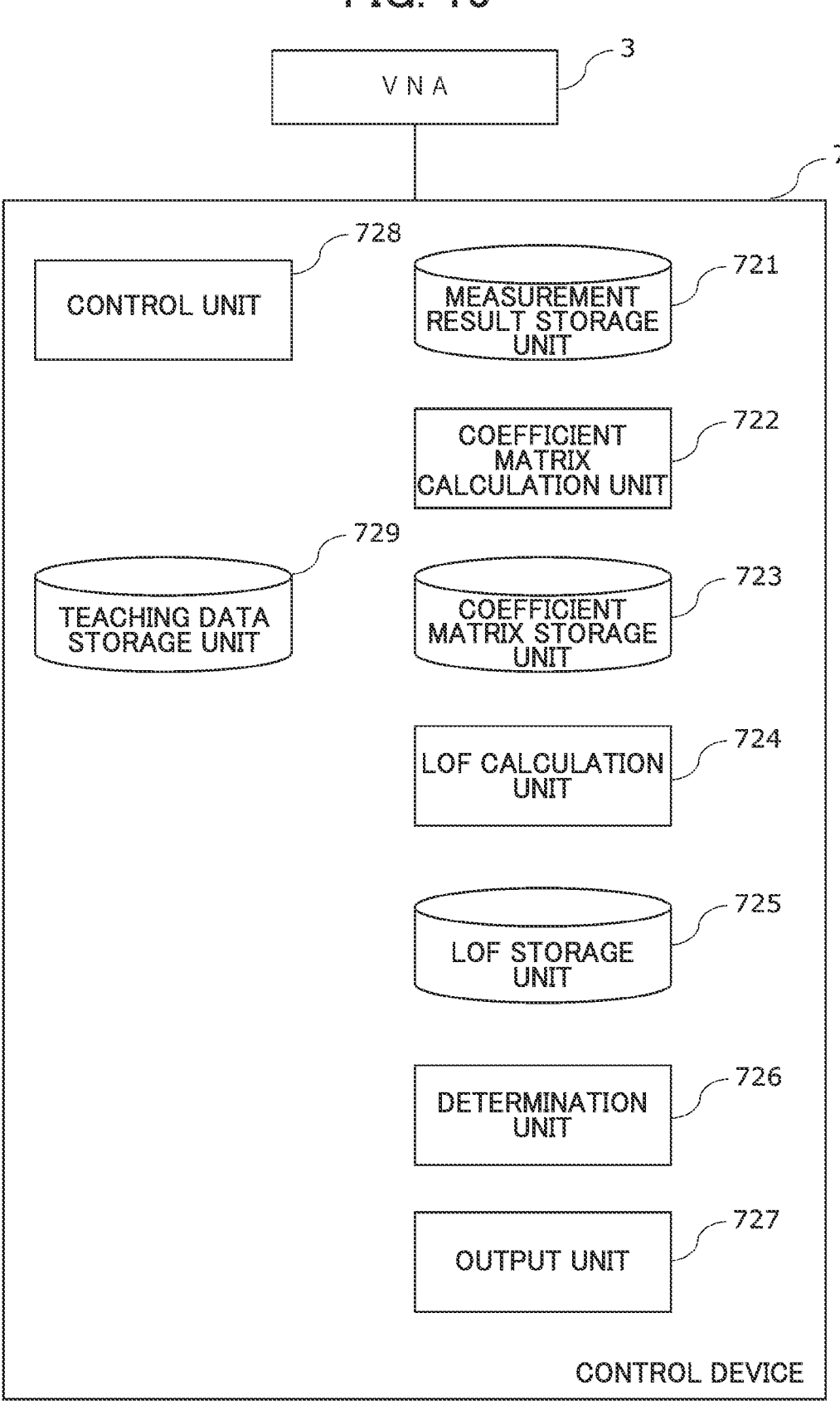
FIG. 10 is a functional block diagram of a control device for determination processing.

FIG. 10 shows a functional configuration example of the control device 7 for determining contact and non-contact of the probe 1 with the contact pad 192. The control device 7 includes a measurement result storage unit 721, a coefficient matrix calculation unit 722, a coefficient matrix storage unit 723, a LOF calculation unit 724, a LOF storage unit 725, a determination unit 726, an output unit 727, a control unit 728, and a teaching data storage unit 729.

The control unit 728 controls the VNA 3, the sample stage 2, the probe stage 16 and the like in accordance with, for example, an instruction from the user, and stores data of the measurement result (S parameter set) received from the VNA 3 in the measurement result storage unit 721. Similarly to the coefficient matrix calculation unit 712, the coefficient matrix calculation unit 722 calculates a coefficient matrix for fitting a predetermined basis function matrix to the S parameter set stored in the measurement result storage unit 721, and stores the coefficient matrix in the coefficient matrix storage unit 723. The LOF calculation unit 724 calculates a value of the local outlier factor $LOF_{det}$ for the coefficient matrix stored in the coefficient matrix storage unit 723 using the coefficient matrix stored in the teaching data storage unit 729, and stores the value in the LOF storage unit 725. The determination unit 726 determines whether or not it has become the contact state by determining whether or not the $LOF_{det}$ stored in the LOF storage unit 725 has exceeded the threshold $LOF_t$ stored in the teaching data storage unit 729. The output unit 727 outputs the determination result of the determination unit 726 to the display unit of the control device 7. The teaching data storage unit 729 stores the coefficient matrix $\theta^h{}_{LS}$ and the threshold $LOF_t$ generated in the processing flow of FIGS. 5A, 5B, and 8.

With reference to FIG. 11, a description will be given of the determination processing of gradually lowering the probe 1 to the contact pad 192 of a DUT (Device Under Test) and determining whether or not the probe 1 is in contact with the contact pad 192. First, the user places the probe 1 on the DUT using, for example, the microscope 20 (Step S31). Since Step S31 is an operation of the user, it is indicated by a dotted-line block.

Next, the control unit 728 controls the probe 1 to approach the DUT by a predetermined distance (Step S33). Furthermore, the control unit 728 causes the VNA 3 to measure the S parameter at the position of the probe 1 for a plurality of predetermined frequencies, and stores the measured S parameter set in the measurement result storage unit 721 (Step S35).

Then, the coefficient matrix storage unit 723 calculates a coefficient matrix for fitting a predetermined basis function matrix to the S parameter set stored, that is measured, in the measurement result storage unit 721, and stores the coefficient matrix in the coefficient matrix storage unit 723 (Step S37). This step is similar to Step S3 and, for example, the real part and the imaginary part of the reflection coefficient are executed and combined. Here, since only the coefficient matrix of h=1 is handled, h is omitted.

That is, a coefficient matrix $\theta_{LS,real}$ for the real part and a coefficient matrix $\theta_{LS,imag}$ for the imaginary part are obtained, and a coefficient matrix obtained by combining two matrices is referred to as a coefficient matrix $\theta_{LS}$ in the same manner as described above. With such a configuration, the coordinates of the point in the complex plane can be represented by each row of the coefficient matrix $\theta_{LS}$.

Figure 5B:
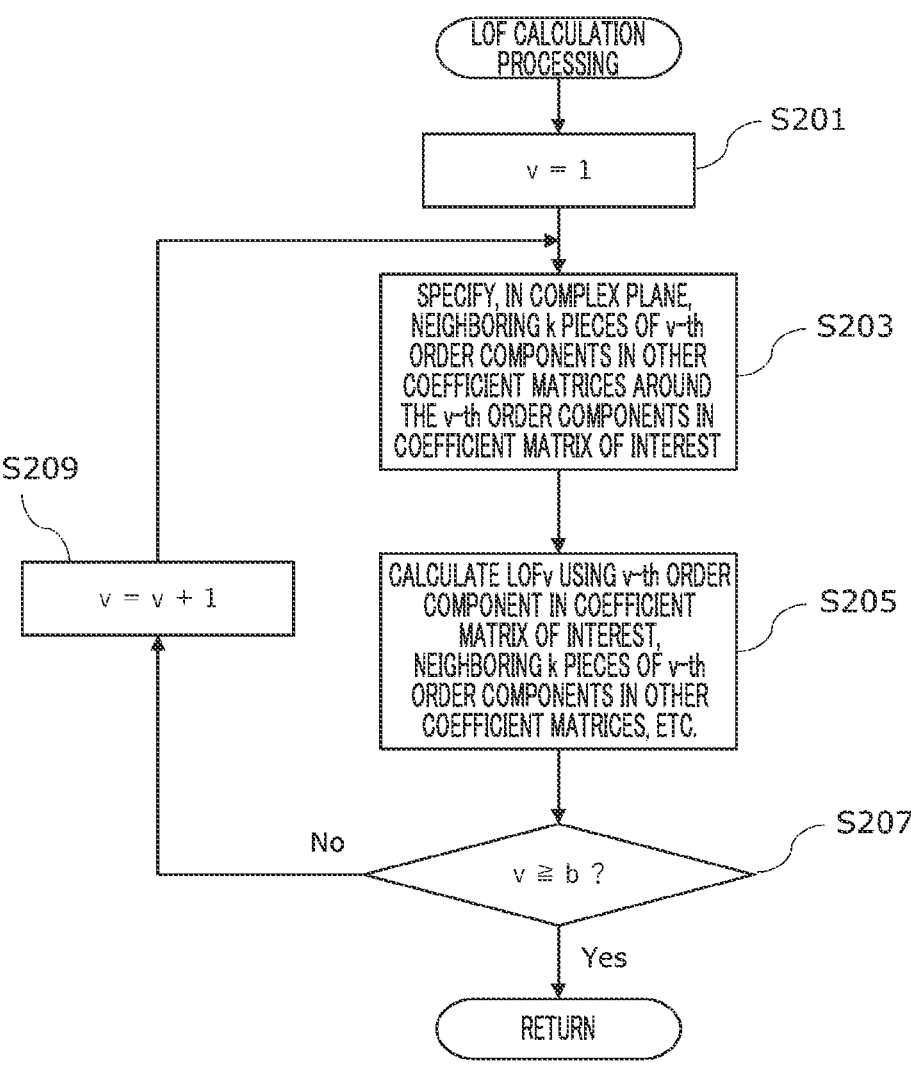
FIG. 5B is a diagram showing a processing flow of LOF calculation processing.

The LOF calculation unit 724 executes LOF calculation processing for the calculated coefficient matrix (Step S39). This step is similar to Step S9, and the processing shown in FIG. 5B is performed. However, the neighboring k pieces of coefficient matrix components are selected from the coefficient matrices stored in the teaching data storage unit 729.

Then, the LOF calculation unit 724 calculates $LOF_{det}$ at the position of the probe 1, i.e., the measurement position, from the $LOF_v$ calculated for each v, and stores the $LOF_{det}$ in the LOF storage unit 725 (Step S41). This step is similar to Step S11, and $LOF_{det}$ is calculated based on the average of $LOF_v$ in the present embodiment.

Then, the determination unit 726 determines whether or not the calculated $LOF_{det}$ has exceeded the threshold LOF t stored in the teaching data storage unit 729 (Step S43). When this condition is not satisfied, the output unit 727 outputs information indicating non-contact to the display unit or the like based on, for example, the output from the determination unit 726 (Step S47). Then, the processing returns to Step S33.

On the other hand, when the condition of $LOF_{det}$>$LOF_t$ is satisfied, it indicates that the contact is made and, therefore, based on the output from the determination unit 726, the output unit 727 outputs information indicating that the contact is made to the display unit or the like (Step S45). Then, the processing ends.

By performing such processing, it is possible to automatically and accurately determine whether or not the probe 1 is in contact with the contact pad 192.

Second Embodiment

In the first embodiment, the expression (1) including a plurality of trigonometric functions is used as a predetermined basis function matrix. However, a basis function matrix including a Gaussian function may be used. Specifically, it includes Gaussian functions for different c as shown below.

$$\varphi(x, c) = \exp\left(-\frac{(x-c)^2}{2h^2}\right) \tag{10}$$

That is, the expression (2) in the first embodiment is provided as follows.

$$f_\theta(x) = \sum_{c=1}^{n} \theta_c \varphi(x, c) \tag{11}$$

The other portions are the same as those of the first embodiment. That is, a coefficient matrix that fits a basis function matrix including a Gaussian function to the measurement result is calculated using a linear least squares method.

Figure 12B:
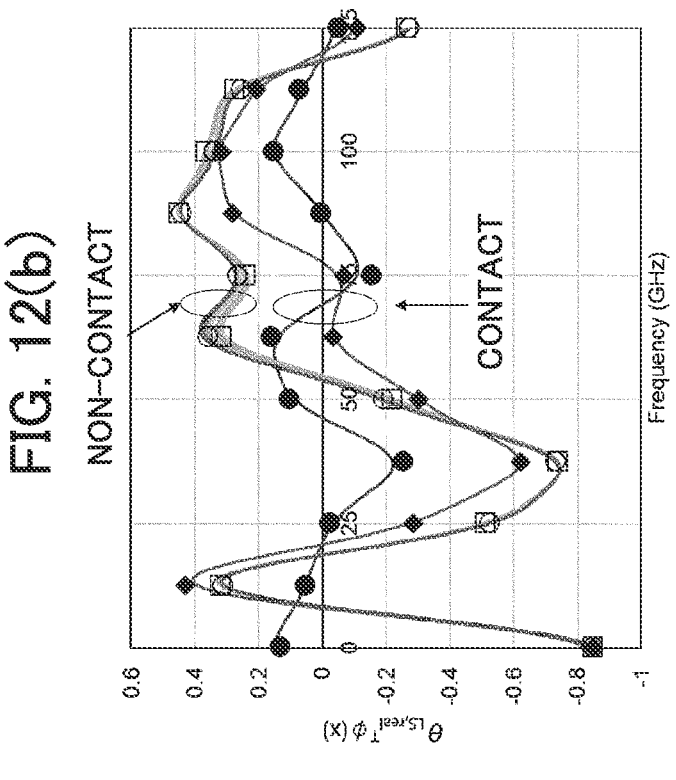
FIGS. 12(a) and 12(b) are diagrams for explaining an example of fitting according to a second embodiment.
Figure 12A:
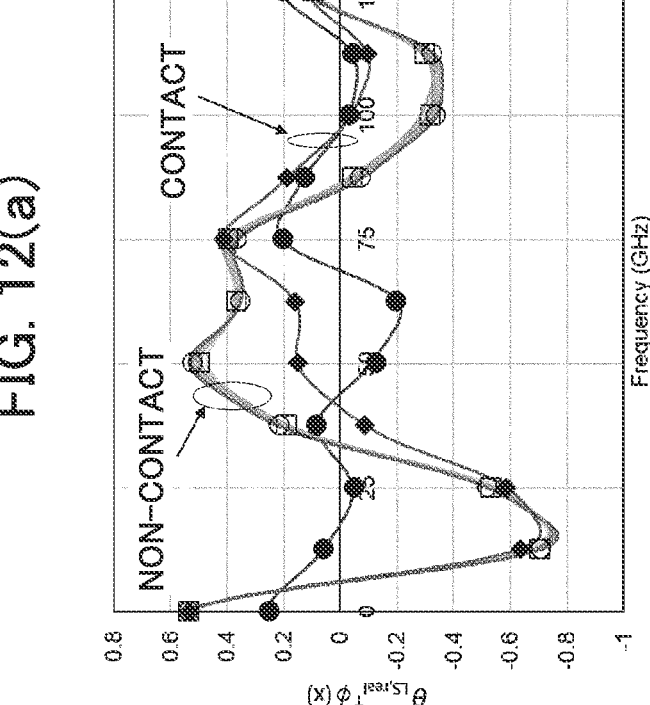

Fitting in such a case will be briefly described with reference to FIG. 12. FIGS. 12(*a*) and 12(*b*) show the relationship between the measurement result of the real part of the frequency and the reflection coefficient and the fitting result ($\theta_{LS,real}^T \varphi(x)$). In FIGS. 12(*a*) and 12(*b*), the points each represents a measurement result, and the curves substantially along the points each represents a fitting result. It can be seen that the measurement results in a case of contact (black diamonds and black circles) and in a case of non-contact (white squares and white circles) are approximately good in fitting.

Figure 13:
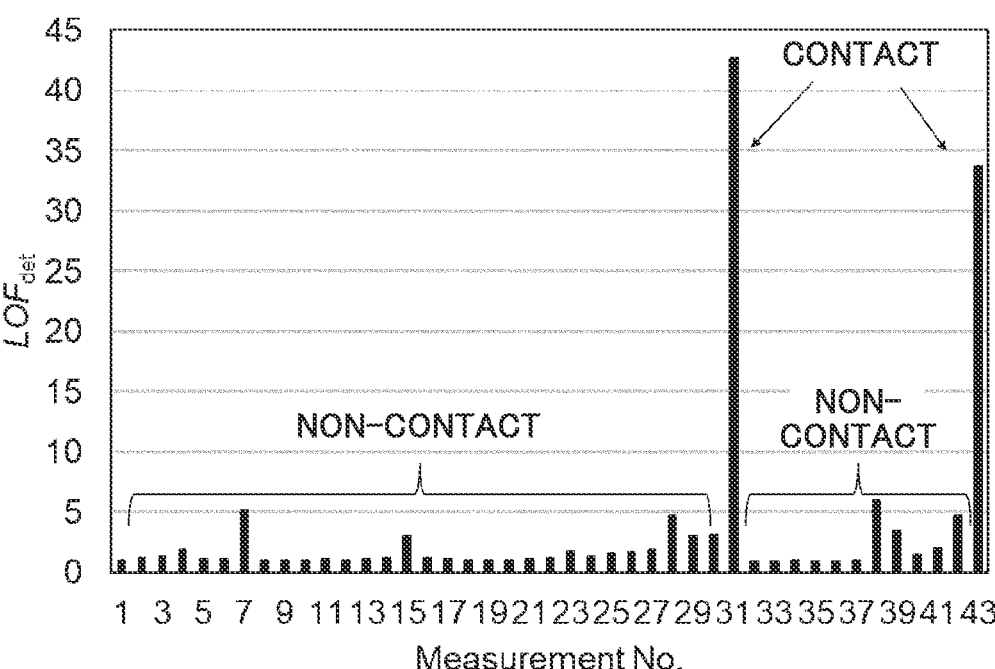
FIG. 13 is a diagram showing a calculation example of $LOF_{det}$ according to the second embodiment.

FIG. 13 shows an example of the calculation result of $LOF_{det}$ As in the case of the first embodiment, the value of $LOF_{det}$ calculated in the case of contact is much larger than that in the case of non-contact, and it is understood that contact and non-contact can be clearly discriminated by appropriately setting the threshold $LOF_t$.

Third Embodiment

In the first and second embodiments, the linear least-squares method is used for calculating the coefficient matrix. However, instead of the simple linear least-squares method, a method of introducing a penalty term $\lambda E$ (E is a unit matrix) for preventing overlearning may be adopted. That is, instead of the expression (5), the following expression may be used.

$$\theta_{LS} = \Phi^\dagger S = (\Phi^T \Phi + \lambda E)^{-1} \Phi^T S \qquad (12)$$

Figure 14B:
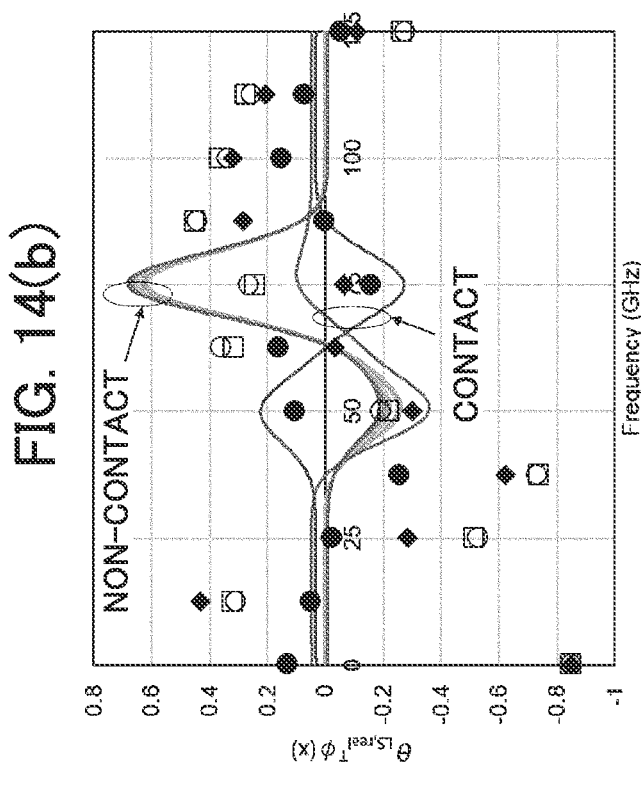
FIGS. 14(a) and 14(b) are diagrams for explaining an example of fitting according to a third embodiment.
Figure 14A:
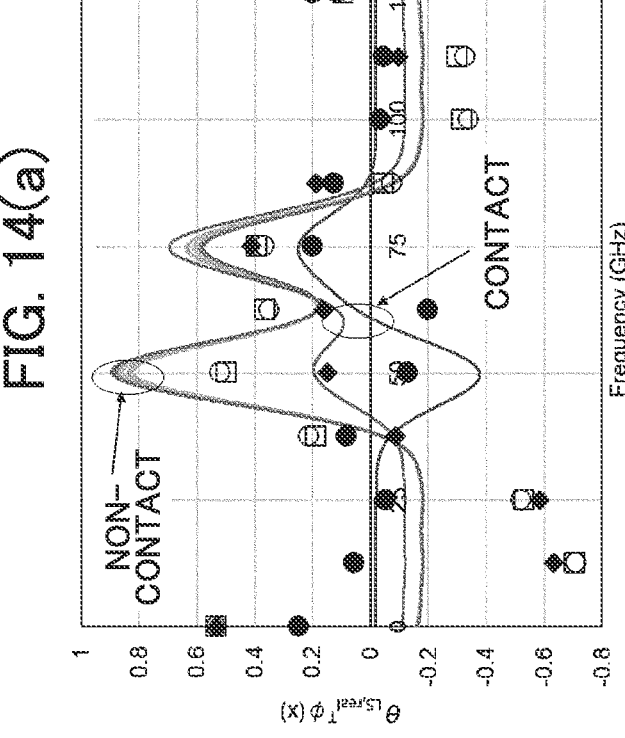

FIG. 14 shows an example of fitting when the penalty term is introduced in the second embodiment. FIGS. 14(*a*) and 14(*b*) show the relationship between the measurement result of the real part of the frequency and the reflection coefficient and the fitting result ($\theta_{LS,real}^T \varphi(x)$). In FIGS. 14(*a*) and 14(*b*), the points each represent a measurement result, and the curves each represent a fitting result. In this example, the fitting is not successful for both the measurement results in the case of contact represented by black diamonds and black circles and the measurement results in the case of non-contact represented by white squares and white circles. This is considered to be because the measurement result is 11 points.

Figure 15:
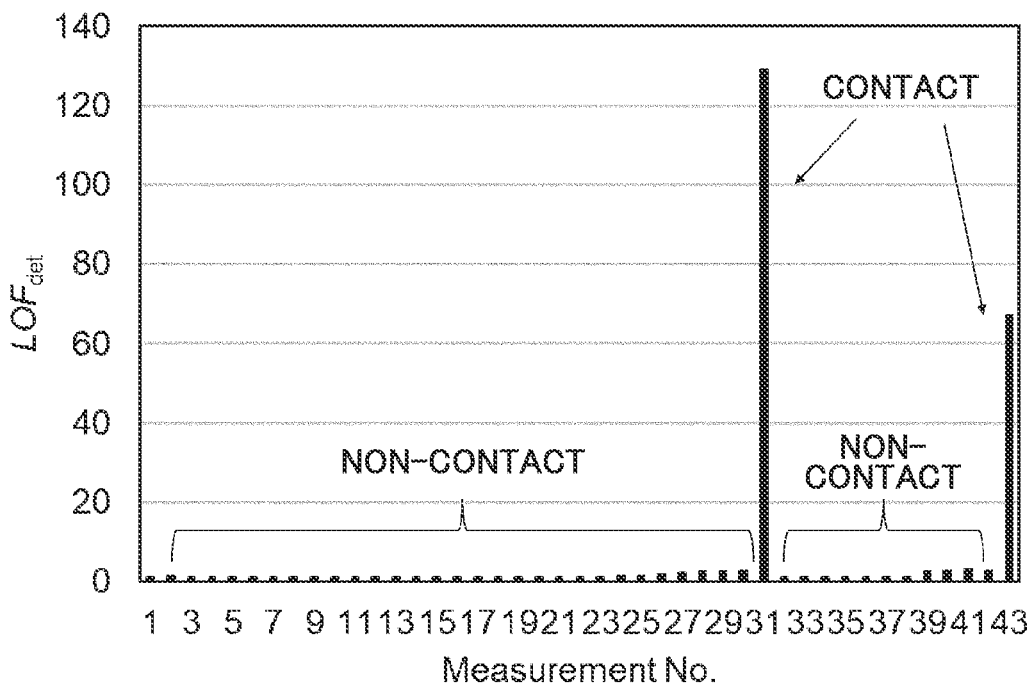
FIG. 15 is a diagram showing a calculation example of $LOF_{det}$ according to the third embodiment.

On the other hand, FIG. 15 shows an example of the calculation result of $LOF_{det}$. As in the first and second embodiments, the value of $LOF_{det}$ calculated in the case of contact is much larger than in the case of non-contact, and it can be understood that contact and non-contact can be clearly discriminated by appropriately setting the threshold $LOF_t$.

Fourth Embodiment

In the first embodiment, $LOF_{det}$ is calculated by averaging $LOF_v$ calculated for each row v of the coefficient matrix, which indicates that each row of the coefficient matrix has the same weight. On the other hand, by appropriately weighting each row in the coefficient matrix, the sensitivity to determination of contact and non-contact may be further increased.

The processing in this case will be described with reference to FIGS. 16 to 18. It should be noted that the same step numbers are given to the same processing as those in FIGS. 5A and 8, and a description thereof will be omitted.

FIG. 16 is substantially the same as FIG. 5A; however, in FIG. 5A, although Step S11 of calculating $LOF_{det}^h$ for the coefficient matrix of interest is executed after Step S9, this Step S11 is not executed in FIG. 16. Therefore, when LOF (=$LOF(\theta_{LS,v}^h)$) for each v is calculated for each coefficient matrix, the processing proceeds to the processing of FIG. 17 via the terminal B.

Proceeding to the description of the processing of FIG. 17, the LOF calculation unit 714 extracts a minimum value in the LOF ($\theta_{LS,v}^h$) (LOF at the time of contact) in the case of contact and a maximum value in the LOF ($\theta_{LS,v}^h$) (LOF at the time of non-contact) in the case of non-contact for each v of all LOFs ($\theta_{LS,v}^h$), and calculates $\Delta LOF_v$ which is a difference therebetween (Step S51). The $\Delta LOF_v$ is also stored in the LOF storage unit 716.

Then, the LOF calculation unit 714 calculates $LOF_{det}^h$ for each coefficient matrix weighted by $\Delta LOF_v$, and stores the $LOF_{det}^h$ in the LOF storage unit 715 (Step S53). After that, the processing proceeds to Step S15, and the same processing as described with reference to FIG. 8 is executed.

In Step S53, $LOF_{det}^h$ is calculated by the following equation.

$$LOF_{det}^h = \frac{\Delta LOF_1}{\sum \Delta LOF_v} \times LOF(\theta_{LS,1}^h) + \dots \frac{\Delta LOF_j}{\sum \Delta LOF_v} \times LOF(\theta_{LS,j}^h) + \dots \qquad (13)$$

$\Sigma \Delta LOF_v$ is the sum of $\Delta LOF_v$ calculated in Step S51. In this way, LOF ($\theta_{LS,v}^h$) for v having a large $\Delta LOF_v$ is given a larger weight, and $LOF_{det}^h$ is calculated.

The fact that $\Delta LOF_v$ is large indicates that the difference between the LOF at the time of non-contact and the LOF at the time of contact is large, and this LOF ($\theta_{LS,v}^h$) indicates that the sensitivity to the determination of the non-contact and contact is high. Therefore, by emphasizing the LOF ($\theta_{LS,v}^h$), it is possible to obtain an effect of increasing the sensitivity of $LOF_{det}^h$ with respect to non-contact and contact determination.

It should be noted that not only the coefficient matrix and the threshold $LOF_t$, but also $\Delta LOF_v$ for calculating the weight of each row of the coefficient matrix are stored in the teaching data storage unit 729 of the control device 7 for determining contact and non-contact with the contact pad 192 of the probe 1.

The processing flow of FIG. 11 for determining contact and non-contact is also changed as shown in FIG. 18.

The difference between FIG. 18 and FIG. 11 is only the portion where Step S41 is replaced with Step S61. In Step S61, the LOF calculation unit 724 calculates $LOF_{det}$ corresponding to the coefficient matrix calculated in Step S37 from the $LOF_v$ calculated in Step S39 and the $\Delta LOF_v$ stored in the teaching data storage unit 729 according to the equation (13), and stores the $LOF_{det}$ in the LOF storage unit 725 (Step S61).

This makes it possible to reflect the weighting of the row of the coefficient matrix with respect to $LOF_{det}$ in the processing of determining contact and non-contact.

Fifth Embodiment

Figure 19:
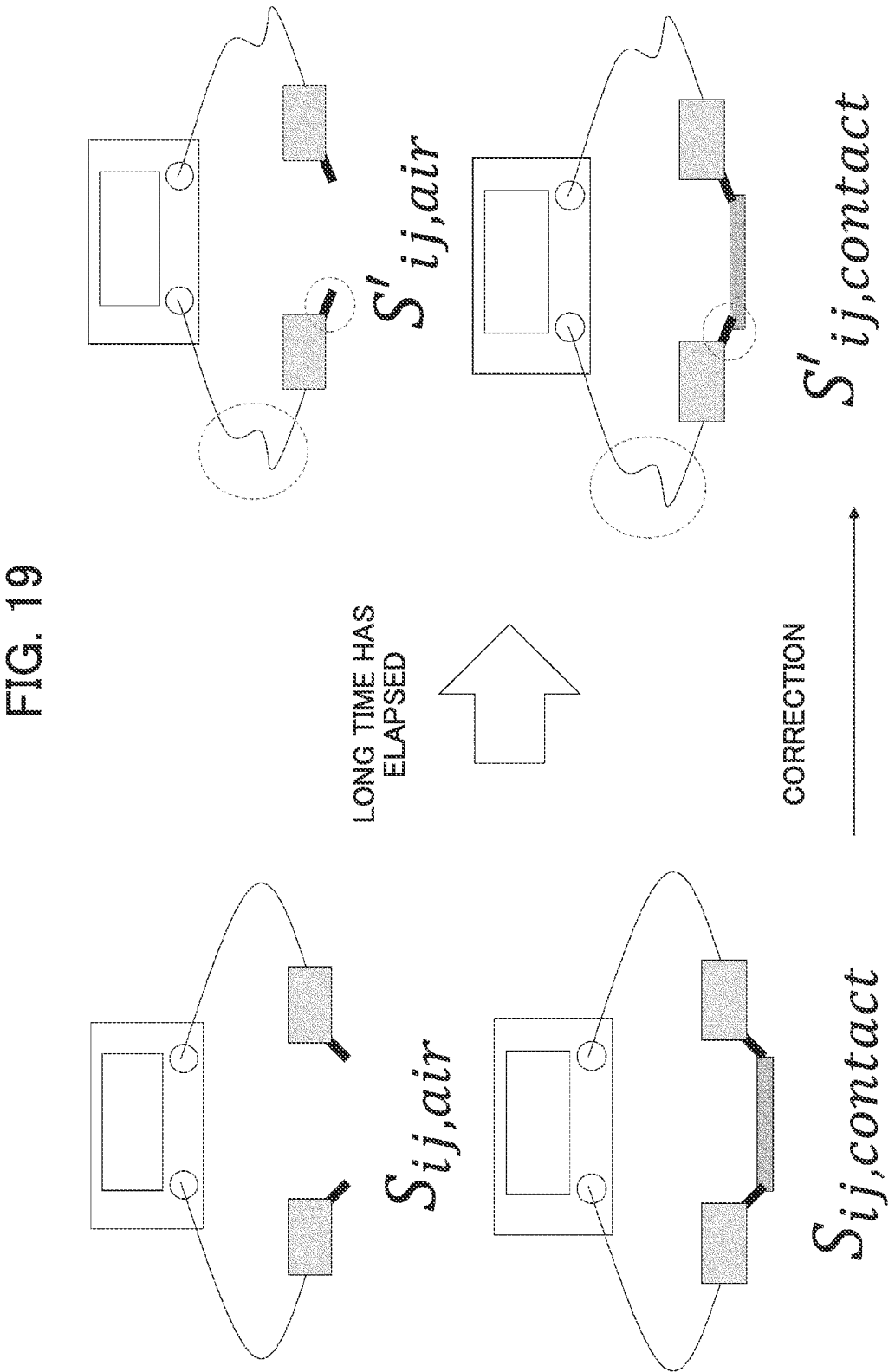
FIG. 19 is a diagram for explaining a problem in the fifth embodiment.

In the first to fourth embodiments, the coefficient matrix and the threshold generated in the pre-processing are used in the determination processing based on the same or similar high-frequency characteristic inspection system 8. However, as schematically shown in FIG. 19, even in the same or similar high-frequency characteristic inspection system 8, when a long time elapses after the pre-processing, there is a possibility that the state of the device changes. In the example of FIG. 19, the state in the left column indicates a state in which the pre-processing is performed, the state in the right column indicates a state after a long time has elapsed, and the dotted circles each indicates an example of a portion in which the state has changed with time.

In such a case, it is not preferable to continue to use the coefficient matrix and the threshold obtained by the pre-processing before the state of the device changes. In the present embodiment, as shown in the right column of FIG. 19, the S parameter set ($S'_{ij,air}$) is newly measured in the case of non-contact, and the past S parameter set used in the pre-processing is corrected using the new S parameter set. In FIG. 19, only the S parameter ($S_{ij,contact}$) in the case of contact used in the pre-processing is corrected. However, the S parameter ($S^*_{ij,air}$) in the case of non-contact used in the pre-processing other than the S parameter as the basis of the correction processing is also corrected in the same manner.

FIG. 20 shows a functional configuration example of the control device 7b that executes determination processing. The main difference from the control device 7 shown in FIG. 10 is in that the teaching data storage unit 729 also stores the S parameter set itself, a correction unit 730 for correcting the S parameter set and a threshold calculation unit 731 having a function similar to that of the threshold calculation unit 716 are additionally included, and the coefficient matrix calculation unit 722 has a function similar to that of the coefficient matrix calculation unit 712.

Figure 21:
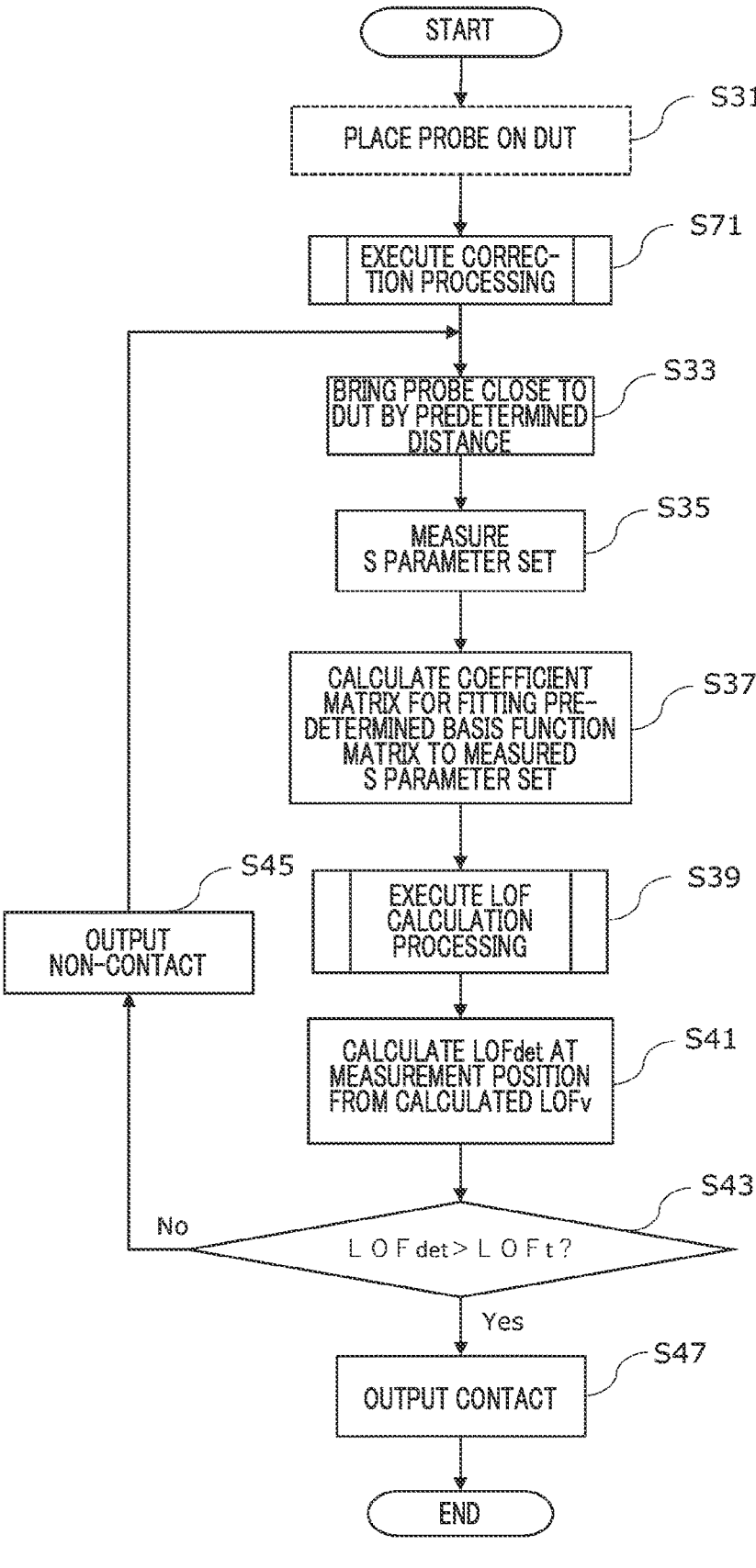
FIG. 21 is a diagram showing a processing flow of determination processing according to the fifth embodiment.
Figure 22:
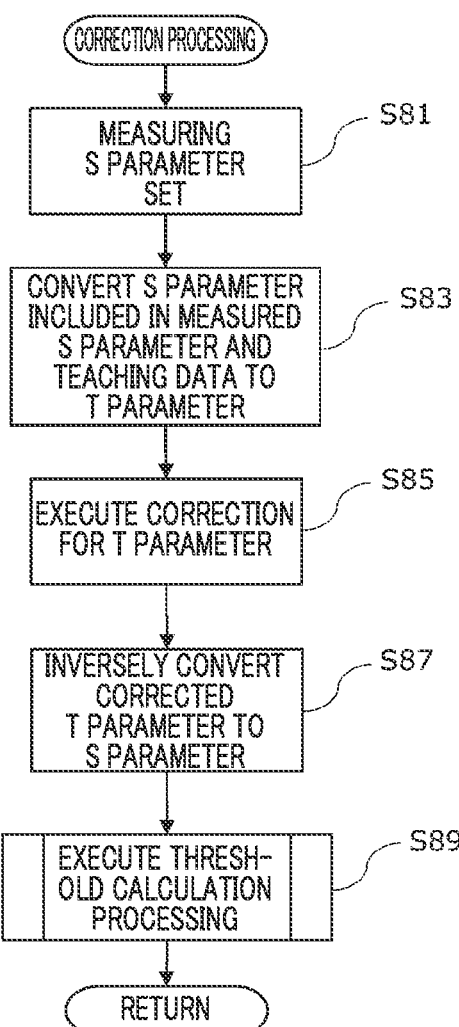
FIG. 22 is a diagram showing a processing flow of correction processing.

Specific contents of the determination processing according to the present embodiment will be described with reference to FIGS. 21 and 22. The processing of FIG. 21 is basically the same as that of FIG. 11, and Step S61 may be adopted instead of Step S41 as shown in FIG. 18. The difference is that after Step S31, the correction unit 730 mainly executes correction processing (Step S71). The correction processing will be described with reference to FIG. 22.

First, in Step S31, since the user places the probe 1 on the DUT using, for example, the microscope 20, the control unit 728 causes the VNA 3 to measure the S parameter set in this state, and stores the S parameter set in, for example, the teaching data storage unit 729 (Step S81). The S parameter is measured for a plurality of frequencies and used as the S parameter ($S'_{ij,air}$) serving as a basis for the correction processing.

Next, the correction unit 730 converts the S parameter measured in Step S81 and the S parameter as teaching data stored in the teaching data storage unit 729 into a T parameter (Step S83). That is, the mathematical operation represented by the following expression is executed for the S parameter for each frequency.

$$\begin{bmatrix} T_{11} & T_{12} \\ T_{21} & T_{22} \end{bmatrix} = \frac{1}{S_{21}} \begin{bmatrix} S_{12}S_{21} - S_{11}S_{22} & S_{11} \\ -S_{22} & 1 \end{bmatrix} \qquad (14)$$

$S_{11}$, $S_{12}$, $S_{21}$ and $S_{22}$ are parameters of the two-terminal pair circuit.

Then, based on the T parameters $T'_{ij,air}$ of the S parameters $S'_{ij,air}$ measured in Step S81 and the T parameters $T_{ij,air}$ of the S parameters $S_{ij,air}$ in the case of non-contact included in the teaching data, the correction unit 730 corrects the T parameters ($T_{ij,contact}$ and $T^*_{ij,air}$) of the other S parameters ($S_{ij,contact}$ and $S^*_{ij,air}$) as the teaching data (Step S85). That is, the following mathematical operation is performed for each frequency.

$$(T'_{ij,contact}) = (T'_{ij,air})(T_{ij,air})^{-1}(T_{ij,contact}) \qquad (15)$$

$$(T'_{ij,air}) = (T'_{ij,air})(T_{ij,air})^{-1}(T^*_{ij,air}) \qquad (16)$$

For example, the S parameters $S_{ij,air}$ used together with the S parameters are preferably S parameters measured when the distance to the contact pad 192 of the probe 1 is substantially the same. For example, when the processing of measuring the probe 1 until the probe 1 comes into contact with the contact pad 192 while gradually lowering the probe 1 is performed a plurality of times (a plurality of approaches), the distance from the contact pad 192 at which the probe 1 starts to be lowered is made substantially the same every time, and the S parameters S are measured at the same distance, so that the S parameter of the first measurement result may be selected. Furthermore, if the distance to the contact pad 192 at the measurement position is recorded every time the measurement is performed, the S parameters $S_{ij,air}$ in which the same distance as the distance in the measurement for the S parameters $S'_{ij,air}$ is recorded may be selected. If a plurality of approaches are performed, the S parameters $S_{ij,air}$ may be selected for each approach.

Then, the correction unit 730 inversely converts the corrected T parameter into an S parameter, and stores the S parameter in the teaching data storage unit 729 (Step S87). That is, the following mathematical operation is performed for each frequency.

$$\begin{bmatrix} S_{11} & S_{12} \\ S_{21} & S_{22} \end{bmatrix} = \frac{1}{T_{22}} \begin{bmatrix} T_{12} & T_{11}T_{22} - T_{12}T_{21} \\ 1 & -T_{21} \end{bmatrix} \qquad (17)$$

Thereafter, the coefficient matrix calculating unit 722 and the threshold calculating unit 731 execute the threshold calculation processing shown in FIGS. 5A, 5B, 8, 16 and 17 (Step S89). Then, the processing returns to the calling source processing. It should be noted that, in FIG. 5A, FIG. 5B and FIG. 8, and FIG. 16 and FIG. 17, the constituent elements illustrated in FIG. 4 are used for explanation; however, in the present embodiment, the constituent elements corresponding to FIG. 20 are used.

By performing the above-described processing, it is possible to perform appropriate determination processing with minimal measurement even when the device state changes.

Sixth Embodiment

In the above-described example, the detection is performed by assuming that the probe 1 is brought into contact with the contact pad 192. However, the first embodiment through the fifth embodiment are also applicable to a case of determining whether a coaxial cable has a good connection or connection failure.

With the advancement of communication technology, the use frequency band is largely extended and, therefore, the size of the coaxial connector is rapidly reduced. Therefore, handling of the coaxial connector becomes very difficult, it is difficult to appropriately connect the coaxial connector, and the coaxial connector may be damaged. Therefore, if it is possible to automatically determine the connection state such as whether the connection is good or failed, even an engineer having superficial experience can grasp the connection state at an early stage and take appropriate measures. The same applies to waveguides instead of coaxial connectors.

Figure 23:
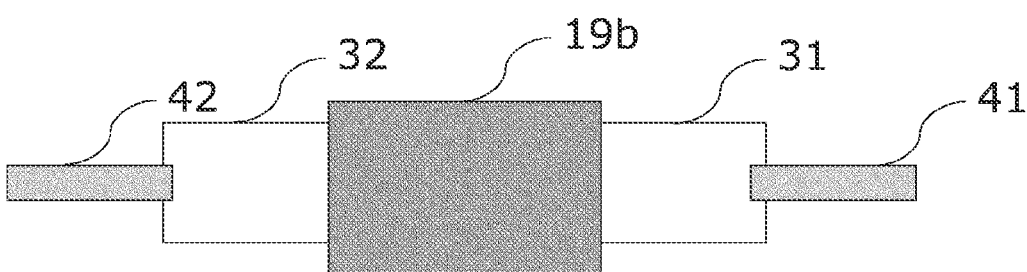
FIG. 23 is a diagram illustrating a coaxial connector.

As illustrated in FIG. 23, a case is assumed in which the coaxial connector 32 to which the cable 42 is connected and the coaxial connector 31 to which the cable 41 is connected are connected to the DUT 19b. The cable 42 and the cable

41 are connected to the frequency expansion unit 4. It should be noted that only one coaxial connector may be provided.

In such a case, the pre-processing is basically the same as in the first to fifth embodiments. However, in the first to fifth embodiments, since it is the main subject to detect the case of contact, the teaching data for the S parameter is prepared so that $LOF_{det}$ becomes a large value in the case of contact. On the other hand, in the present embodiment, since it is the main subject of the present invention to detect the case of a connection failure, a large number of S parameter sets in the case of good connection are measured and a small number of S parameter sets in the case of the connection failure are measured so that $LOF_{det}$ becomes large in the case of the connection failure, and they are stored in the measurement result storage unit 711. With such a configuration, the above-described "contact" is replaced with "connection failure" and the "non-contact" is replaced with "contact" to perform processing.

Figure 24:
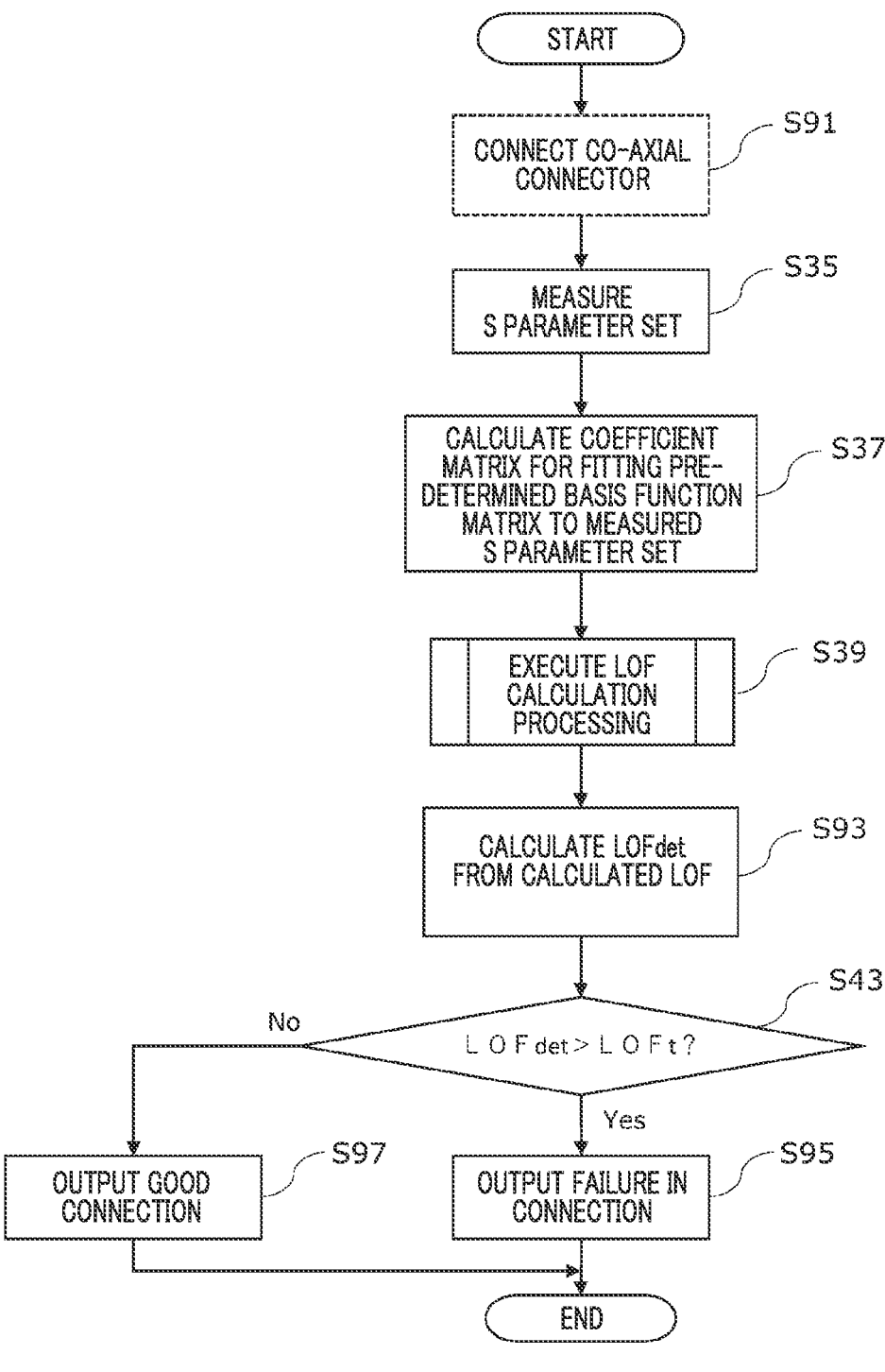
FIG. 24 is a diagram showing a processing flow of determination processing according to a sixth embodiment.

On the other hand, the determination processing is as shown in FIG. 24. Also in FIG. 24, only portions different from FIG. 11 will be described. First, the user connects the coaxial connector 31 to the DUT 19*b* (step S91). Since the operation is for the user, the block in Step S91 is a dotted line block. Since the coaxial connector is not gradually brought close to the probe as in the case of the probe, the processing shown in Step S33 of FIG. 11 is not performed. Although the Steps S35 to S39 for measuring the S parameter set and calculating the LOF are the same, the $LOF_{det}$ is not the $LOF_{det}$ for the measurement position, but the $LOF_{det}$ for the current connection state, so the mathematical operation contents are the same as those of the Step S41 or S61, but the LOF calculation unit 724 calculates the $LOF_{det}$ from the LOF V calculated for each row v of the calculated coefficient matrix and stores the $LOF_{det}$ in the LOF storage unit 725 (Step S91).

Then, the determination unit 726 determines whether or not the calculated $LOF_{det}$ has exceeded the threshold LOF t stored in the teaching data storage unit 729 (Step S43). When this condition is not satisfied, the output unit 727 outputs information indicating that the connection is good to the display unit or the like based on, for example, the output from the determination unit 726 (Step S97). Then, the processing ends.

On the other hand, when the condition of $LOF_{det} > LOF_t$ is satisfied, since connection failure occurs, the output unit 727 outputs information indicating that the connection failure occurs to the display unit or the like based on the output from the determination unit 726 (Step S95). Then, the processing ends.

By performing such processing, it is possible to automatically and accurately determine whether the coaxial connector 31 is correctly connected to the DUT 19*b* or failed in connection.

Figure 25A:
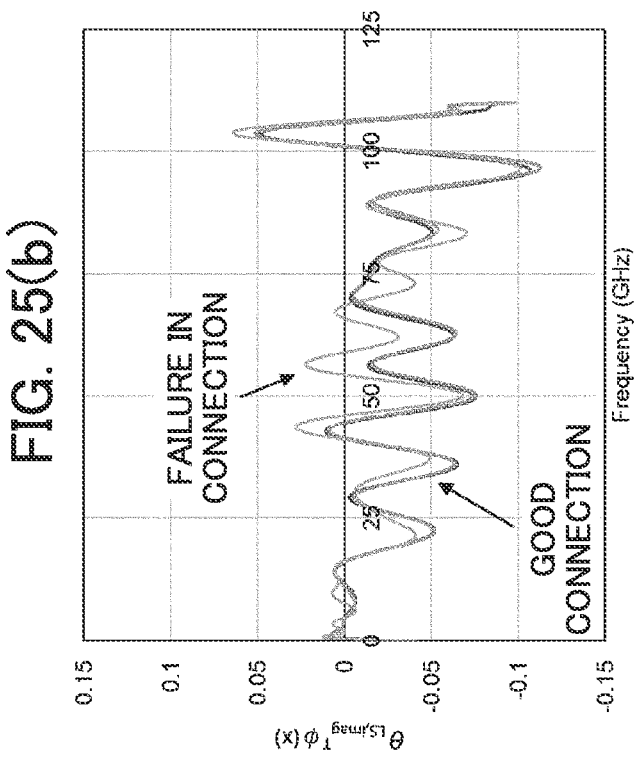
FIGS. 25(a) and 25(b) are diagrams showing an example of fitting according to the sixth embodiment.
Figure 25B:
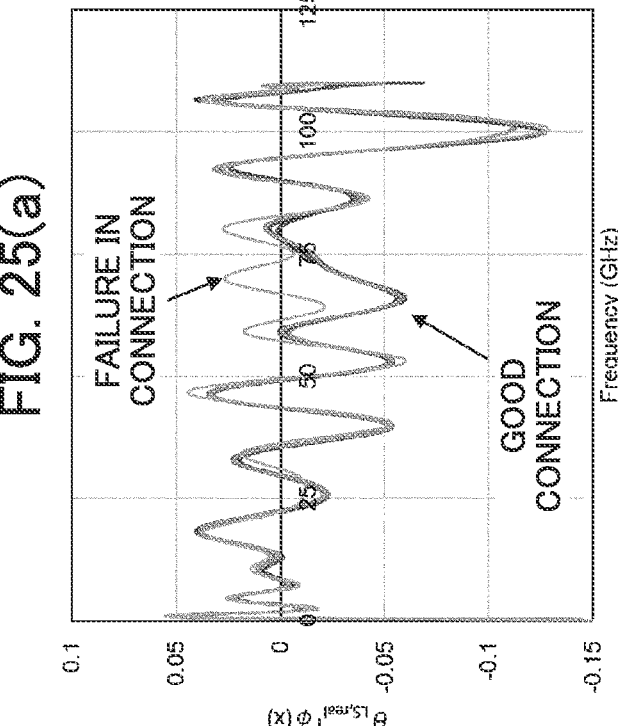
Figure 26:
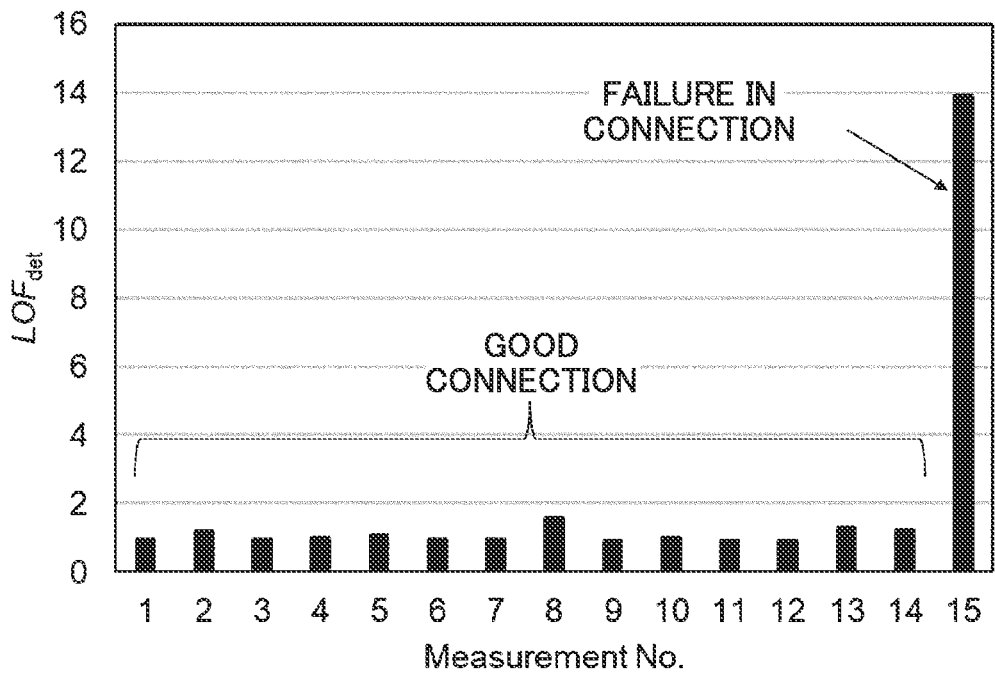
FIG. 26 is a diagram showing a calculation example of $LOF_{det}$ according to the sixth embodiment.

FIG. 25 shows an example of fitting in a case where the equation (1) is used as a function matrix in the case of the coaxial connector 31. FIG. 25(*a*) shows the relationship between the result of fitting of the real part of the frequency and the reflection coefficient ($\theta_{LS,real}{}^T \varphi(x)$), and FIG. 25(*b*) shows the relationship between the result of fitting of the imaginary part of the frequency and the reflection coefficient ($\theta_{LS,imag}{}^T \varphi(x)$). Although the measurement results are not plotted, good fitting results are obtained. FIG. 26 shows an example of the calculation result of $LOF_{det}$. It is understood that the value of $LOF_{det}$ calculated in the case of connection failure is much larger than in the case of good connection, and by appropriately setting the threshold $LOF_t$, it is possible to clearly discriminate between contact and non-contact.

Also in the case of the coaxial connector 31, processing including correction processing may be performed in the same manner as in the fifth embodiment. In this case, prior to Step S91 in FIG. 24, the S parameter set in the case of good connection is measured, and the correction processing (FIG. 22) using the S parameter set is inserted, whereby it is possible to handle.

Although the embodiments of the present invention have been described above, the present invention is not limited thereto. The elements of each embodiment may be combined in any way. Furthermore, in each embodiment, any elements may be removed and implemented. With respect to the processing flow, the order may be switched or a plurality of steps may be executed in parallel unless the processing result is changed. The functional block configurations of the control devices 7 and 7*b* shown in FIGS. 4, 10, and 20 are merely examples, and may be different in the program module configuration, the file configuration, and the like. The control device executing the pre-processing and the control device executing the determination processing may be the same or different.

Instead of implementing the functions of the control device 7 or 7*b* by one computer, a plurality of computers may cooperate to implement the functions of the control device 7 or 7*b*. In either case, the control device 7 or 7*b* may be referred to as an information processing system.

Figure 27:
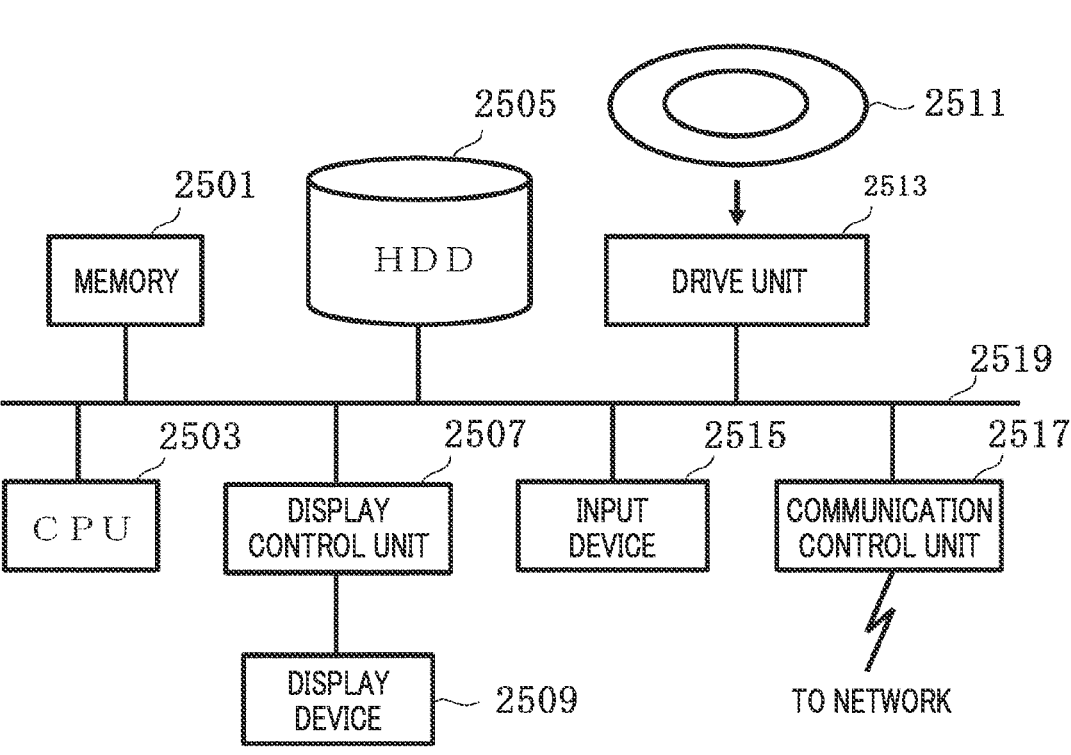
FIG. 27 is a diagram showing a functional configuration example of a computer serving as an information processing apparatus.

The control device 7 or 7*b* described above is, for example, a computer device, and as shown in FIG. 27, memory 2501, a CPU (Central Processing Unit) 2503, a hard disk drive (HDD) 2505, a display control unit 2507 connected to a display device 2509, a drive unit 2513 for a removable disk 2511, an input device 2515, a communication control unit 2517 for connecting to a network, and a peripheral device connection unit 2521 for connecting to a peripheral device (including an image sensor 100, an attenuation mechanism 300, a cooling mechanism 400, and other components) are connected by a bus 2519. The HDD may be a storage device such as a solid state drive (SSD). An operating system (OS) and application programs for carrying out the processing according to the embodiments of the present invention are stored in the HDD 2505, and are read from the HDD 2505 to the memory 2501 when executed by the CPU 2503. The CPU 2503 controls the display control unit 2507, the communication control unit 2517, and the drive unit 2513 according to the processing contents of the application program to perform a predetermined operation. Furthermore, the data in the middle of processing is mainly stored in the memory 2501, but may be stored in the HDD 2505. For example, application programs for carrying out the above-described processing are each stored in a computer-readable removable disk 2511, distributed, and installed from the drive unit 2513 to the HDD 2505. The application programs may be installed in the HDD 2505 via a network such as the Internet and the communication control unit 2517. In such a computer apparatus, the above-described hardware such as the CPU 2503 and the memory 2501 and the programs such as the OS and the application program perform various functions as described above by organically cooperating with each other.

The embodiments described above are summarized as follows.

The determination method according to the present embodiment is directed to a determination method that includes the steps of: (A) measuring an S parameter at a current position of a probe, or at a current connection state of a coaxial connector or a waveguide for a plurality of frequencies; (B) calculating a coefficient matrix for fitting a predetermined function matrix to a frequency characteristic of the measured S parameter; (C) calculating a value of a first local outlier factor based on the calculated coefficient matrix; and (D) determining, based on a relationship between the calculated first local outlier factor and a threshold, whether the probe is in a first state in which the probe is in contact with a predetermined object or in a second state in which the coaxial connector or the waveguide is failed in connection with a predetermined object.

By using the local outlier factor (LOF) based on the coefficient matrix fitted to the frequency characteristics of the S parameter measured in this manner, it is possible to automatically and accurately determine whether being in the first state or the second state.

Furthermore, in the above determination method, when the probe is used, a predetermined object may be a contact pad on a substrate. In this case, the step of determining may further include, when it is determined that the probe is not in contact with the contact pad on the substrate, moving a position of the probe, measuring the S parameter for a plurality of frequencies at the moved position, and performing again the step of calculating a coefficient matrix, the step of calculating the value of the first local outlier factor, and the step of determining. In this way, the probe is gradually brought closer to the contact pad (e.g., an electrode), and the movement of the probe can be stopped when it is determined that the probe is brought into contact with the contact pad.

Furthermore, the above determination method may further include the steps of: (E) evaluating each of a plurality of threshold candidates by using a value of a second local outlier factor when being in the first state or the second state is known and a value of a third local outlier factor when not being in the first state or the second state is known; and (F) selecting one of the plurality of threshold candidates based on a result of the step of evaluating. Based on the known data, it is possible to select a threshold with which an appropriate determination can be made.

Furthermore, the determination method may further include (G) measuring a second S parameter in a state which is not the first state or in the second state, (H) correcting, based on the second S parameter, an S parameter measured when being in the first state or the second state is known and an S parameter measured when not being in the first state or the second state is known; and (I) calculating the value of the second local outlier factor and the value of the third local outlier factor using the corrected S parameter. For example, when the state of the device changes with time, by using the second S parameter in a state which is not a state to be detected, the S parameter already possessed can be appropriately corrected and an appropriate threshold can be recalculated.

Furthermore, the step of calculating the coefficient matrix described above may be performed on the real part and the imaginary part of the S parameter, and the step of calculating the value of the first local outlier factor may further include the steps of (c1) calculating, by using a component for each order in a first coefficient matrix for a real part of the S parameter and a second coefficient matrix for an imaginary part of the S parameter, a value of a fourth local outlier factor for each order, and (c2) calculating the value of the first local outlier factor based on the value of the fourth local outlier factor. For example, the value of the local outlier factor can be calculated based on the distance in the complex plane.

Furthermore, the step of calculating the value of the first local outlier factor based on the value of the fourth local outlier factor may further include (c21) calculating the value of the first local outlier factor by averaging the value of the fourth local outlier factor or adding the fourth local outlier factor by weighting. It should be noted that the weight may be set to be larger as the sensitivity to non-contact and contact determination is higher.

Furthermore, the above determination method may further include: (J) calculating a third coefficient matrix for fitting the predetermined function matrix to a frequency characteristic of an S parameter measured when being in the first state or the second state is known for a real part and an imaginary part of the S parameter; (K) calculating a fourth coefficient matrix for fitting the predetermined function matrix to a frequency characteristic of an S parameter measured when not being in the first state or the second state is known for a real part and an imaginary part of the S parameter; (L) calculating, by using a component for each order of the third coefficient matrix for the real part and the imaginary part and a component for each order of the fourth coefficient matrix for the real part and the imaginary part, a value of a fifth local outlier factor for each order of the third coefficient matrix for the real part and the imaginary part and calculating a value of a sixth local outlier factor for each order of the fourth coefficient matrix for the real part and the imaginary part; (M) calculating the value of the second local outlier factor based on the value of the fifth local outlier factor; and (N) calculating the value of the third local outlier factor based on the value of the sixth local outlier factor. The values of the second and third local outlier factors described above can be suitably calculated.

The above determination method may further include (O) calculating the weight for each order of the third coefficient matrix and the fourth coefficient matrix based on the value of the fifth local outlier factor and the value of the sixth local outlier factor. Furthermore, the value of the second local outlier factor may be calculated by adding the value of the fifth local outlier factor by weighting with a weight for each row; and the value of the third local outlier factor may be calculated by adding the value of the sixth local outlier factor by weighting with a weight for each row.

It should be noted that the predetermined function matrix described above may be a matrix including a trigonometric function or a matrix including a Gaussian function. Furthermore, the fitting described above may be performed by a linear least squares method or a linear least squares method involving overlearning suppression.

A program for causing a computer to execute the above-described method can be created, and the program is stored in various storage media.

The invention claimed is:

1. A determination method comprising the steps of:
   measuring an S parameter at a current contact state of a probe, or at a current connection state of a coaxial connector or a waveguide for a plurality of frequencies;
   calculating a coefficient matrix for fitting a predetermined function matrix to a frequency characteristic of the S parameter measured;
   calculating a value of a first local outlier factor based on the calculated coefficient matrix;
   when the probe is used, determining, in accordance with whether the calculated first local outlier factor has exceeded a threshold, whether the probe is in a first state in which the probe is in contact with a predetermined object; or when the coaxial connector or the waveguide is used, determining based on a relationship between the calculated first local outlier factor and a threshold, whether the coaxial connector or the waveguide is in a second state in which the coaxial connector or the waveguide is failed in connection with a predetermined object; and passing or failing the predetermined object based on a result of inspection from the measuring the S parameter, the calculating the coefficient matrix, and the determining in accordance with whether the calculated first local outlier factor has exceeded a threshold, or the determining based on the relationship between the calculated first outlier factor and the threshold.

2. The determination method according to claim 1, wherein when the probe is used, the predetermined object is a contact pad on a substrate, and the step of determining further includes, when it is determined that the probe is not in contact with the contact pad on the substrate, moving a position of the probe, measuring the S parameter for a plurality of frequencies at a moved position, and performing again the step of calculating a coefficient matrix, the step of calculating the value of the first local outlier factor, and the step of determining.

3. The determination method according to claim 1, further comprising the steps of:

evaluating each of a plurality of threshold candidates by using a value of a second local outlier factor when being in the first state or the second state is known and a value of a third local outlier factor when not being in the first state or the second state is known; and selecting one of the plurality of threshold candidates based on a result of the step of evaluating.

4. The determination method according to claim 3, further comprising the steps of:

calculating a third coefficient matrix for fitting the predetermined function matrix to a frequency characteristic of an S parameter measured when being in the first state or the second state is known for a real part and an imaginary part of the S parameter;

calculating a fourth coefficient matrix for fitting the predetermined function matrix to a frequency characteristic of an S parameter measured when not being in the first state or the second state is known for a real part and an imaginary part of the S parameter;

calculating, by using a component for each order of the third coefficient matrix for the real part and the imaginary part and a component for each order of the fourth coefficient matrix for the real part and the imaginary part, a value of a fifth local outlier factor for each order of the third coefficient matrix for the real part and the imaginary part and calculating a value of a sixth local outlier factor for each order of the fourth coefficient matrix for the real part and the imaginary part;

calculating the value of the second local outlier factor based on the value of the fifth local outlier factor; and calculating the value of the third local outlier factor based on the value of the sixth local outlier factor.

5. The determination method according to claim 4, further comprising the steps of:

calculating a weight for each order of the third coefficient matrix and the fourth coefficient matrix based on the value of the fifth local outlier factor and the value of the sixth local outlier factor;

calculating the value of the second local outlier factor by adding the value of the fifth local outlier factor by weighting with a weight for each row; and calculating the value of the third local outlier factor by adding the value of the sixth local outlier factor by weighting with a weight for each row.

6. The determination method according to claim 3, further comprising the steps of:

measuring a second S parameter in a state which is not the first state or the second state;

correcting, based on the second S parameter, an S parameter measured when being in the first state or the second state is known and an S parameter measured when not being in the first state or the second state is known; and calculating the value of the second local outlier factor and the value of the third local outlier factor using a corrected S parameter.

7. The determination method according to claim 1, wherein the step of calculating the coefficient matrix is performed on a real part and an imaginary part of the S parameter, and the step of calculating the value of the first local outlier factor further includes the steps of calculating, by using a component for each order in a first coefficient matrix for a real part of the S parameter and a second coefficient matrix for an imaginary part of the S parameter, a value of a fourth local outlier factor for each order, and calculating the value of the first local outlier factor based on the value of the fourth local outlier factor.

8. The determination method according to claim 7, wherein the step of calculating the value of the first local outlier factor based on the value of the fourth local outlier factor further includes calculating the value of the first local outlier factor by averaging the value of the fourth local outlier factor or adding the fourth local outlier factor by weighting.

9. The determination method according to claim 1, wherein the predetermined function matrix is a matrix including a trigonometric function or a matrix including a Gaussian function.

10. The determination method according to claim 1, wherein the fitting is performed by a linear least squares method or a linear least squares method involving overlearning suppression.

11. A non-transitory computer readable medium storing a program that causes a computer to execute the steps of:

calculating a coefficient matrix for fitting a predetermined function matrix to a frequency characteristic of an S parameter measured at a current contact state of a probe, or at a current connection state of a coaxial connector or a waveguide for a plurality of frequencies;

calculating a value of a first local outlier factor based on the calculated coefficient matrix;

when the probe is used, determining, in accordance with whether the calculated first local outlier factor has exceeded a threshold, whether the probe is in a first state in which the probe is in contact with a predetermined object; or when the coaxial connector or the waveguide is used, determining based on a relationship between the calculated first local outlier factor and a threshold, whether the coaxial connector of the waveguide is in a second state in which the coaxial connector or the waveguide is failed in connection with a predetermined object; and passing or failing the predetermined object based on a result of inspection from the measuring the S param- eter, the calculating the coefficient matrix, and the determining in accordance with whether the calculated first local outlier factor has exceeded a threshold, or the determining based on the relationship between the calculated first outlier factor and the threshold.

12. An information processing device comprising:

memory; and a processor connected to the memory;

wherein the processor is configured to execute the steps of:

calculating a coefficient matrix for fitting a predetermined function matrix to a frequency characteristic of an S parameter measured at a current contact state of a probe, or at a current connection state of a coaxial connector or a waveguide for a plurality of frequencies;

calculating a value of a first local outlier factor based on the calculated coefficient matrix;

when the probe is used, determining, in accordance with whether the calculated first local outlier factor has exceeded a threshold, whether the probe is in a first state in which the probe is in contact with a predeter- mined object; or when the coaxial connector or the waveguide is used, determining based on a relationship between the cal- culated first local outlier factor and a threshold, whether the coaxial connector or the waveguide is in a second state in which the coaxial connector or the waveguide is failed in connection with a predetermined object; and passing or failing the predetermined object based on a result of inspection from the measuring the S param- eter, the calculating the coefficient matrix, and the determining in accordance with whether the calculated first local outlier factor has exceeded a threshold, or the determining based on the relationship between the calculated first outlier factor and the threshold.

* * * * *